United States Patent
Marutani

(10) Patent No.: US 11,002,893 B2
(45) Date of Patent: May 11, 2021

(54) TRANSMISSION GRATING AND LASER DEVICE USING THE SAME, AND METHOD OF PRODUCING TRANSMISSION GRATING

(71) Applicant: NICHIA CORPORATION, Anan (JP)

(72) Inventor: Yukitoshi Marutani, Anan (JP)

(73) Assignee: NICHIA CORPORATION, Anan (JP)

(*) Notice: Subject to any disclaimer, the term of this patent is extended or adjusted under 35 U.S.C. 154(b) by 303 days.

(21) Appl. No.: 15/961,090

(22) Filed: Apr. 24, 2018

(65) Prior Publication Data

US 2018/0306952 A1 Oct. 25, 2018

(30) Foreign Application Priority Data

Apr. 25, 2017 (JP) .............................. JP2017-086432

(51) Int. Cl.
*G02B 5/18* (2006.01)
*H01S 5/40* (2006.01)
(Continued)

(52) U.S. Cl.
CPC ....... *G02B 5/1866* (2013.01); *G02B 27/1086* (2013.01); *H01S 5/4012* (2013.01);
(Continued)

(58) Field of Classification Search
CPC ........... G02B 5/1866; G02B 27/1086; G02B 6/4215; G02B 6/29311; G02B 27/1006;
(Continued)

(56) References Cited

U.S. PATENT DOCUMENTS 6,788,849 B1 * 9/2004 Pawluczyk ........... G01J 3/1838
385/37
2005/0128592 A1 6/2005 Nishii et al.
(Continued)

FOREIGN PATENT DOCUMENTS

JP 2003-128429 A 5/2003
JP 2004-306134 A 11/2004
(Continued)

OTHER PUBLICATIONS

Fan T Y (2005), "Laser Beam Combining for High-Power High-Radiance Sources", IEEE Journal of Selected Topics in Quantum Electronics, vol. 11, No. 3, May/Jun. 2005, pp. 567-577.

*Primary Examiner* — Kimberly N. Kakalec
(74) *Attorney, Agent, or Firm* — Foley & Lardner LLP

(57) ABSTRACT

A transmission grating includes: first light-transmissive regions having a refractive index of $n_1$; and second light-transmissive regions having a refractive index of $n_2$ that is smaller than $n_1$. Light-reflecting interfaces on which light transmitted through the first light-transmissive regions is incident are in parallel with one another and are inclined such that a line normal to each of light-reflecting interfaces is at an inclination angle θ with respect to the flat light-incident surface and to the flat light-emitting surface, wherein 0°<θ<90°. When a thickness of the first light-transmissive regions in a direction perpendicular to the light-reflecting surfaces is $t_1$ and a thickness of the second light-transmissive regions in a direction perpendicular to the light-reflecting surfaces is $t_2$, the thickness $t_2$, in μm, is in a range of $0.1/\pi(n_1^2-n_2^2)^{1/2}$ to $t_1$.

6 Claims, 18 Drawing Sheets

(51) Int. Cl.
*G02B 27/10* (2006.01)
*H01S 5/14* (2006.01)

(52) U.S. Cl.
CPC .......... *H01S 5/4062* (2013.01); *H01S 5/4087* (2013.01); *H01S 5/141* (2013.01); *H01S 5/4031* (2013.01)

(58) Field of Classification Search
CPC .......... G02B 5/1871; G02B 2005/1804; H01S 5/4062; H01S 5/4012; H01S 5/4087; H01S 5/141; H01S 5/4031
See application file for complete search history.

(56) References Cited

U.S. PATENT DOCUMENTS

| | | | |
|---|---|---|---|
| 2006/0274391 A1* | 12/2006 | Dickson | G02B 5/1814 359/1 |
| 2007/0182931 A1 | 8/2007 | Ushiro et al. | |
| 2009/0074356 A1* | 3/2009 | Sanchez | G02B 6/0056 385/31 |
| 2011/0279818 A1* | 11/2011 | Amako | G01J 3/44 356/328 |
| 2017/0184797 A1* | 6/2017 | Baudot | G02B 6/305 |

FOREIGN PATENT DOCUMENTS

| | | |
|---|---|---|
| JP | 2005-037872 A | 2/2005 |
| JP | 2005-195919 A | 7/2005 |
| JP | 2006-053992 A | 2/2006 |
| JP | 2006-189695 A | 7/2006 |
| JP | 2007-187732 A | 7/2007 |
| JP | 2009-063754 A | 3/2009 |
| WO | WO-2009/135982 A1 | 11/2009 |

* cited by examiner

Cross-Section A-A

Cross-Section B-B

TRANSMISSION GRATING AND LASER DEVICE USING THE SAME, AND METHOD OF PRODUCING TRANSMISSION GRATING

CROSS-REFERENCE TO RELATED PATENT APPLICATION

The present application claims priority under 35 U. S. C. § 119 to Japanese Patent Application No. 2017-086432 filed on Apr. 25, 2017, the contents of which are hereby incorporated by reference in their entirety.

BACKGROUND

The present disclosure relates to a transmission grating and a laser device using the same, and a method of producing the transmission grating.

A wavelength beam combining (WBC) technique to increase the brightness of semiconductor laser device is known. In this technique, laser light (beams) emitted from a plurality of semiconductor laser elements are collimated by an optical element (collimate lens) into substantially parallel light and made incident on a wavelength dispersive element (reflection grating) such that the beams are overlapped by wavelength-dispersive properties of the diffraction grating (for example, described in "Laser Beam Combining for High-Power High-Radiance Sources" T. Y Fan, IEEE Journal of Selected Topics in Quantum Electronics, Vol. 11, No. 3, May/June 2005, pp. 567-577).

SUMMARY

A transmission grating experiences reflection loss at a surface absent of a grating pattern when diffracted light is transmitted therethrough. However, the above described reflection grating experiences substantially none of the reflection loss that occurs in a transmission grating, and therefore is said to provide higher diffraction efficiency compared to that of the transmission grating.

In a WBC laser light source device, if a reflection grating is employed as the wavelength dispersive element, a first optical element, which is provided to transmit an incident beam that is emitted from a light source and incident on the wavelength dispersive element, and a second optical element, which is provided to transmit an emission beam from the wavelength dispersive element, are needed to be located at the same side when seen from the wavelength dispersive element side. Increasing the number of laser elements in the laser light source device to achieve higher optical output would require an increase in the size of the first optical element to transmit the incident beams to the wavelength dispersive element. When the size of the first optical element is increased, the space required for the first optical element and the space required for the second optical element would be difficult to be separated from each other in such a WBC laser light source device. This imposes a limitation on the number of the laser elements that can be incorporated in a single laser light source device, which in turn limits the increase in the optical output. Moreover, in some cases a metal film is disposed on the surface of the reflection grating to improve the reflectance of the reflection grating. However, absorption of light by the metal film cannot be completely eliminated, which may contribute to an increase of heat generation of the reflection grating due to absorption of light at high output power. Such heat generation would reduce the reliability of the diffraction grating. In order to reduce such heat generation, an improvement is required not only to the diffraction grating but also to the entire laser light source device in which the reflection grating is incorporated. In other words, such heat generation would lead degradation of performance and reliability of the WBC laser light source device. Whereas, a transmission grating is made of a transparent material and such degradations caused by heat generation can be avoided, though optical loss due to mirror surface reflection is greater in a transmission grating than that in a reflection grating. In other words, a transmission grating exhibits lower diffraction efficiency.

Further, because a single diffraction grating, either a conventional transmission grating or a conventional reflection grating, requires microscopic blazes to be formed in the surface, production of large quantities of diffraction gratings at a low production cost have been difficult.

Accordingly, an object of certain embodiments of the present invention is to provide a transmission grating with high diffraction efficiency that can be mass produced at low cost, and a method of producing the same.

A transmission grating according to one embodiment of the present disclosure has a flat light-incident surface and a flat light-emitting surface, and includes a plurality of first light-transmissive regions having a refractive index of $n_1$ and a plurality of second light-transmissive regions having a refractive index of $n_2$ that is smaller than $n_1$. The first light-transmissive regions and the second light-transmissive regions are alternately disposed at a diffraction grating period of d, where adjacent regions have an interface therebetween.

Among a plurality of interfaces between the first light-transmissive regions and the second light-transmissive regions, light-reflecting interfaces on which light transmitted through the first light-transmissive regions is made incident are in parallel with one another and also inclined such that a line normal to each of the light-reflecting interfaces is at an inclination angle θ (0°<θ<90°) with respect to the flat light-incident surface and to the flat light-emitting surface.

When a thickness of the first light-transmissive regions in a direction perpendicular to the light-reflecting surfaces is $t_1$ and a thickness of the second light-transmissive regions in a direction perpendicular to the light-reflecting surfaces is $t_2$, the thickness $t_2$, in μm, is in a range of $0.1/\pi(n_1^2-n_2^2)^{1/2}$ to $t_1$.

A method of producing a transmission grating according to one embodiment of the present disclosure includes: providing two glass plates each having a first main surface and a second main surface located opposite to the first main surface, the first main surface defining a plurality of elongated reverse trapezoidal grooves of reverse trapezoidal shape in a vertical cross-section, each defined by a first wall, a second wall, and a bottom surface, with an upper opening width a, a bottom width b, and a depth h. The first walls of the elongated reverse trapezoidal grooves are in parallel to one another and the second walls of the elongated reverse trapezoidal grooves are in parallel to one another, and the elongated reverse trapezoidal grooves are formed at an uniform interval of (a+b−d1), thus providing a plurality of elongated trapezoidal protrusions each having trapezoidal cross-section with a first wall and a second wall between adjacent elongated reverse trapezoidal grooves; engaging the elongated trapezoidal protrusions of one of the two glass plates with the elongated reverse trapezoidal grooves of the other of the two glass plates to fit the two glass plates to each other; and closely fitting the walls of one side of the elongated trapezoidal protrusions with the walls of one side of the elongated reverse trapezoidal grooves, closely fitting the upper surfaces of the elongated trapezoidal protrusions with the bottom surfaces of the elongated reverse trapezoidal grooves, and bonding to each other.

A method of producing a transmission grating according to one embodiment of the present disclosure includes: stacking a plurality of thin glass plates of a same thickness with a predetermined space between each two adjacent thin glass plates to obtain a multi-layered glass structure in which each two adjacent thin glass plates are facing each other across the space; fusing a glass on each lateral surface of the multi-layered glass structure to confine the spaces in the multi-layered glass structure; supporting the multi-layered glass structure with the sealed spaces by a glass support structure, at an upper surface, a lower surface, and two lateral surfaces opposite to each other with respect to a central axis that is parallel to the upper surface and the lower surface of the multi-layered structure; heating the multi-layered glass structure together with the glass support structure to collectively soften, and drawing the multi-layered glass structure and the glass support structure in a direction parallel to the central axis; and cutting the drawn multi-layered glass structure together with the drawn glass support structure in a direction parallel to a second plane perpendicular to a first plane including the central axis and a stacking direction of the thin glass plates.

A method of producing a transmission grating according to one embodiment of the present disclosure includes: providing a plurality of thin glass plates of a same thickness, each having a first main surface, a second main surface opposite to the first main surface, a first lateral surface, a second lateral surface, a third lateral surface, and a fourth lateral surface; the first main surface of each of the thin glass plates defining a plurality of grooves with a predetermined opening width and respectively extending from the first lateral surface side to the third lateral surface side, where the first lateral surface and the third lateral surface are located opposite to each other; stacking the plurality of thin glass plates such that openings of the grooves at the lateral end faces are arranged in a predetermined aligning direction to assemble a multi-layered glass structure; fusing an end surface portion of the multi-layered glass structure that includes the first lateral surface of the thin glass plates, an end surface portion of the multi-layered glass structure that includes the second lateral surface of the thin glass plates, an end surface portion of the multi-layered glass structure that includes the third lateral surface of the thin glass plates, and an end surface portion of the multi-layered glass structure that includes the fourth lateral surface of the thin glass plates, to bond adjacent thin glass plates and also seal the opening ends of the grooves; supporting the multi-layered glass structure containing the sealed grooves by a glass support structure, at the upper surface, the lower surface, the end surface containing the second lateral surfaces of the thin glass plates, and the end surface containing the fourth lateral surfaces of the thin glass plates and located opposite to the end surface containing the second lateral surfaces with respect to the central axis; heating the multi-layered glass structure together with the glass support structure to collectively soften, and drawing the multi-layered glass structure and the glass support structure in a direction parallel to the central axis; cutting the drawn multi-layered glass structure together with the drawn glass support structure in a direction parallel to a first plane that is perpendicular to the central axis; and further cutting the multi-layered glass structure and the drawn glass support structure in a direction parallel to a second plane that is in parallel to the predetermined aligning direction of the grooves.

According to one aspect of the present invention, a transmission grating with high diffraction efficiency that can be mass produced at low costs can be provided. According to another aspect of the present invention, a method of producing a transmission grating with high diffraction efficiency that can be mass produced at low costs can be provided. According to another aspect of the present invention, a laser device that includes the transmission grating with high diffraction efficiency according to certain embodiments and that that can be mass produced at low costs can be provided.

BRIEF DESCRIPTION OF THE DRAWINGS

FIG. 1B is a schematic diagram illustrating a side view of a first light-transmissive region of the transmission grating shown in FIG. 1A.

FIG. 1C is a schematic diagram illustrating a side view of a second light-transmissive region of the transmission grating shown in FIG. 1A.

DETAILED DESCRIPTION OF THE EMBODIMENTS

Figure 1A:
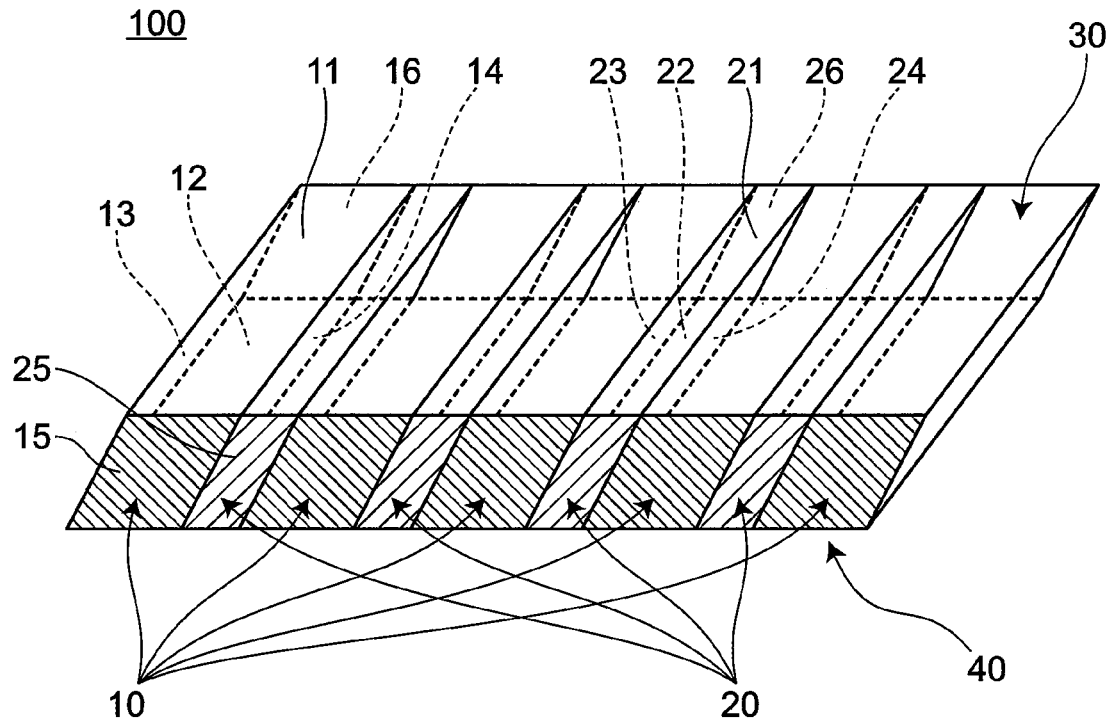
FIG. 1A is a schematic diagram illustrating a perspective view of a transmission grating according to a first embodiment.
Figure 1A:
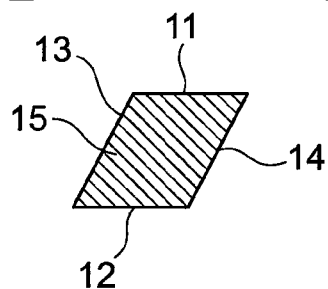
Figure 1A:
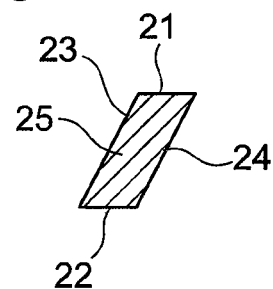

Certain embodiments according to the present invention will be described below with reference to the accompanying drawings. It is to be noted that the light emitting device described below is intended for implementing the technical concepts of the present invention, and the present invention is not limited to those described below unless otherwise specified. Also, descriptions of one embodiment and/or one example can be applied to other embodiments and/or other examples. In the description below, the same designations or the same reference numerals refer to same or like members, and duplicative descriptions will be appropriately omitted. The size, positional relationship and the like in the drawings may be exaggerated for the sake of clarity.

First Embodiment

A transmission grating according to a first embodiment of the present invention will be described below.

The transmission grating according to the first embodiment is of a volume phase diffraction grating. As shown in FIGS. 1A-1C, the transmission grating according to the first embodiment includes a plurality of first light-transmissive regions 10 each having a refractive index of $n_1$ and a plurality of second light-transmissive regions 20 each having a refractive index of $n_2$ that is smaller than the first refractive index $n_1$, alternately arranged between a flat light-incident surface 30 and a flat light-emitting surface 40. Each of the first light-transmissive regions 10 is a first rectangular parallelepiped member or region having two congruent parallelogram bases: a first base 15 and a second base 16, and four rectangular lateral surfaces: a first, second, third, and fourth lateral surfaces 11, 12, 13, and 14 between the first base 15 and the second base 16. The first lateral surface is located at a light-incident side, the second lateral surface is located at a light-emitting side, the third lateral surface is located at a first light-reflecting interface, and the fourth lateral surface is located at a second light-reflecting interface, to be described below. Each of the second light-transmissive regions 20 is a second rectangular parallelepiped member or region having two congruent parallelogram bases: a first base 25 and a second base 26, and four rectangular lateral surfaces: a first, second, third, and fourth lateral surfaces 21, 22, 23, and 24 between the first base 25 and the second base 26. One opposite angles of the first base 15 and the first base 25 are 90°−θ and the other opposite angles of the first base 15 and the first base 25 are 90°+θ. The length of one pair of opposite sides of the first base 15 of the first light-transmissive region 10 is equal to the length of one pair of opposite sides of the first base 25 of the second light-transmissive region 20. In other words, the third and fourth lateral surfaces 13, 14 of each of the first light-transmissive regions 10 and the third and fourth lateral surfaces 23, 24 of each of the second light-transmissive regions 20 are all congruent. In the configuration described above, the first and second lateral surfaces 11, 12 of the first light-transmissive regions 10 and the first and second lateral surfaces 21, 22 of the second light-transmissive regions 20 are such that at least the long sides of the first and second lateral surfaces 11, 12 and the long sides of the first and second lateral surfaces 21, 22 have a same length and each of adjacent first lateral surface 11 and the first lateral surface 21 share a single long side, and each of adjacent second lateral surface 12 and the second lateral surface 22 share a single long side.

A plurality of the first rectangular parallelepipeds (the first light-transmissive regions 10) and a plurality of the second rectangular parallelepipeds (the second light-transmissive regions 20) as described above are alternately arranged to form the transmission grating of the first embodiment. At this time, (i) the first lateral surfaces 11 and the first lateral surfaces 21 are located on a same plane and the lateral surface 12 and the lateral surface 22 are located on a same plane, and also (ii) each of two adjacent lateral surfaces of the third lateral surface 13 and the fourth lateral surface 24 are in contact with each other and each of two adjacent lateral surfaces of the fourth lateral surface 14 and the third lateral surface 23 are in contact with each other. In the transmission grating of the first embodiment, the first lateral surfaces 11 and the first lateral surfaces 21 located on a same plane constitute a flat light-incident surface 30, and the second lateral surfaces 12 and the second lateral surfaces 22 located on a same plane constitute a flat light-emitting surface 40.

Figure 2:
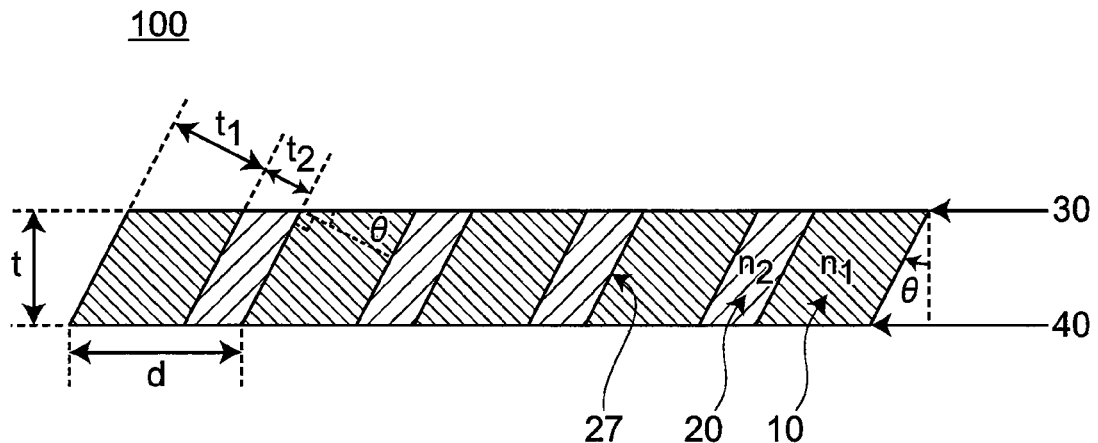
FIG. 2 is a schematic diagram illustrating a cross-section of the transmission grating shown in FIG. 1.

The transmission grating of the first embodiment with a configuration described above has a plurality of surfaces where two adjacent lateral surfaces of the fourth lateral surface 14 and the third lateral surface 23 are in contact with each other (creating interfaces between the first light-transmissive regions 10 and the second light-transmissive regions 20), each constituting a first light-reflecting interface 27 where light transmitted through the first light-transmissive region is incident and reflected. A line normal to the first light-reflecting interface 27 is inclined at an inclination angle θ (0°<θ<90°) to the flat light-incident surface 30 and the flat light-emitting surface 40. A normal vector pointing from the first light-reflecting interface 27 toward the first light-transmissive region 10 side is directed to the flat light-emitting surface. The inclination angle θ in a range of greater than 0° and equal or smaller than 45° is suitable for a transmission grating. The plurality of first light-reflecting interfaces 27 are in parallel to one another. The distance between two adjacent light-reflecting interfaces 27 on the flat light-incident surface or the flat light-emitting surface is the diffraction grating period d of the transmission grating of the first embodiment. That is, as shown in FIG. 2, the diffraction grating period d is a sum of widths of two adjacent lateral surfaces 11 and 21.

When a thickness of the first light-transmissive regions in a direction perpendicular to the first light-reflecting interfaces 27 is $t_1$ and a thickness of the second light-transmissive regions in a direction perpendicular to the light-reflecting surfaces is $t_2$, the thickness $t_0$ of the second light-transmissive region 20, in μm, is preferably in a range of $0.1/\pi(n_1^2-n_2^2)^{1/2}$ to $t_1$. The thickness $t_1$ of the first light-transmissive region is determined as a product of the width of the first lateral surface 11 and cosine of inclination angle θ (cos θ). The thickness $t_0$ of the second light-transmissive region 20 is determined as a product of the width of the first lateral surface 21 and cosine of inclination angle θ (cos θ).

The transmission grating of the first embodiment will be described in detail below.

In the description below, the distance between the flat light-incident surface 30 and the flat light-emitting surface 40 is indicated as a diffraction grating region thickness t. The plurality of first light-transmissive regions 10 are made of a first transparent material having a refractive index $n_1$. The plurality of second light-transmissive regions 20 can be made of a second transparent material having a refractive index $n_2$ ($1 \leq n_2 < n_1$) or, alternatively, may be formed by a liquid, a vacuum whose refractive index is 1, or a gas that has a refractive index of approximately 1. The refractive index $n_1$ may be referred to as "high refractive index $n_1$", and the refractive index $n_2$ may be referred to as "low refractive index $n_2$" in the description below. When a material has a refractive index n, a thickness T, and an optical absorption coefficient α, the transmittance to light from a vacuum perpendicularly incident on two parallel plates made of the material can be expressed as $(1-R)^2 e^{-\alpha T}$, where e is the base of natural logarithm, R is a reflectance of light perpendicularly incident on a material having a refractive index of n in vacuum. In the present specification, the term "(a) transparent material" refers that the material has an internal transmittance $e^{-\alpha T}$ of 0.9 or greater, more preferably 0.99 or greater. For example, the optical absorption coefficient α of the material is preferably 0.01 cm$^{-1}$ or less, more preferably 0.001 cm$^{-1}$ or less. Further preferably, the imaginary component of the refractive index $n_j$ (j is zero or a positive integer; j=1, 2, . . . ) of the material can be assumed zero and the material exhibits substantially no absorption of light (i.e., absorption of light in the material with a thickness t can be negligible). When the absorption of light by the material is negligible, heat generation in the material due to absorption of light can be negligible even when the optical density is increased. Thus, reliability of the diffraction grating that employs the material and the light source device that employs the diffraction grating can be improved.

The first transparent material and the second transparent material are preferably inorganic materials. Because, inorganic materials generally have superior light-resisting properties than organic materials. For example, an optical glass such as a synthetic quartz glass, a borosilicate crown glass known as BK7 can be used for the first transparent material. For the second transparent material, for example, an optical glass such as a synthetic quartz glass, a borosilicate crown glass known as BK7 can be used or, alternatively, vacuum, air, nitrogen gas, a rare gas, or the like, can be used. Further, depending on the wavelength to diffract, an elemental semiconductor such as silicon or germanium, a compound semiconductor such as ZnS, GaAs, or GaN, a metal oxide such as sapphire, gallium oxide, zinc oxide, or hafnium oxide, or other material, such as a dielectric material can be used as the first transparent material and/or the second transparent material.

As described above, a line normal to the first light-reflecting interface 27 is inclined at an inclination angle of θ to the flat light-incident surface 30 and the flat light-emitting surface 40. In the transmission grating of the first embodiment, the inclination angle θ can be in a range of 0°≤θ<90°, but the inclination angle θ in a range of 0°≤θ<45° is preferable.

In the transmission grating of the first embodiment, the light passing through the first light-transmissive region 10 and reflected from the first light-reflecting interface 27 is used as the transmitted diffracted light. Accordingly, when $t_1$ is greater than $t_2$, a greater amount of light is allowed to pass the first light-transmissive region 10. Thus, in order to increase the amount of light reflected at the first light-reflecting interface 27 and increase the diffraction efficiency, a greater $t_1$ than $t_2$ is preferable.

The operation of a transmission grating according to the first embodiment will be described in detain below, with reference to FIG. 3 and FIG. 4.

In the description below, light having a wavelength $\lambda$ in vacuum is assumed to be incident on the flat light-incident surface. In the figures, incident light is oriented at an angle (incident angle) $\alpha$ to a line normal to the flat light-incident surface of the diffraction grating region, and an m-order diffracted light is oriented at an angle (diffraction angle) $\beta m$ (where m is an integer $(0, \pm 1, \pm 2, \ldots,$ order of the diffraction) to a line normal to the flat light-emitting surface (or the flat light-incident surface) of the diffraction grating region. In the case of a plurality of different wavelengths of incident light, $\lambda_i$ denotes the wavelength in vacuum of incident light i, $\alpha_i$ denotes the angle (the incident angle) between the incident light i and the normal to the flat light-incident surface of diffraction grating region, where i is an integer. In the description below, $\theta$ is in a range of 0° to 45° (FIGS. 1A-1C, FIG. 2).

In the transmission grating shown in FIG. 2, the diffraction grating periods d, and $t_1$, $t_2$, and $\theta$ satisfy the relationship (1).

$$d=(t_1+t_2)/\cos \theta \tag{1}$$

Figure 3:
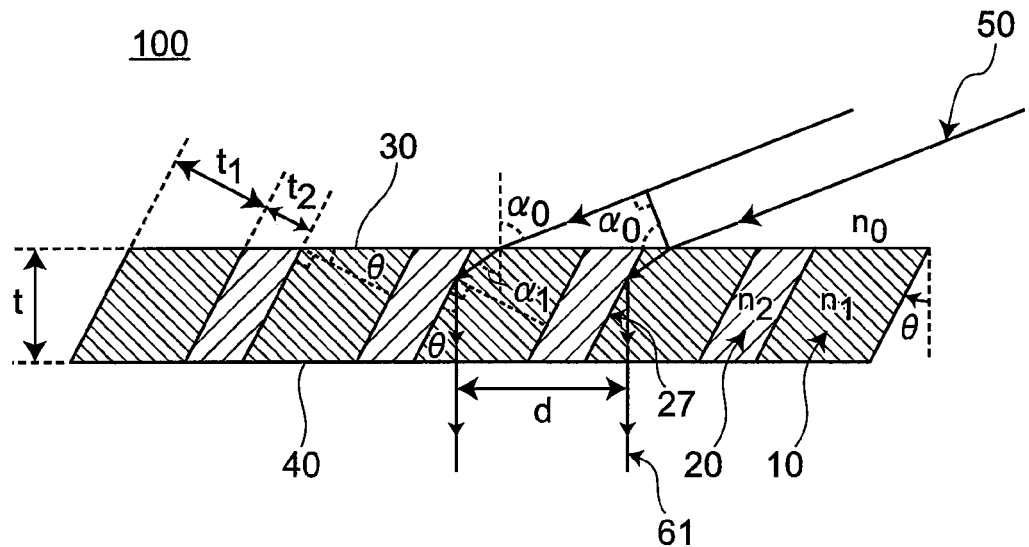
FIG. 3 shows the transmission grating according to the first embodiment, illustrating a first-order transmitted diffracted light with a diffraction angle of zero.

FIG. 3 illustrates an incident light entering the transmission grating 100 shown in FIG. 2, at an incident angle $\alpha_0$ to the flat light-incident surface 30, from a space with a refractive index $n_0$. As illustrated in FIG. 3, light 50 incident on the first light-transmissive region 10 with a refractive index $n_1$, in the flat light-incident surface 30 (first lateral surface 11) at an angle of incidence $\alpha_0$, propagates in the first light-transmissive region 10 at an angle of refraction $\alpha_1$. According to Snell's law, $n_0$, $\alpha_0$, $n_1$, and $\alpha_i$ satisfy the relationship (2).

$$n_1 \sin \alpha_1 = n_0 \sin \alpha_0 \tag{2}$$

The incident light to the transmission grating 100 is reflected at the first light-reflecting interface 27. In this case, according to the law of reflection, the angle of incidence and the angle of reflection to the first light-reflecting interface 27 are equal. The reflected light is transmitted through the first light-transmissive region 10 and emitted from the flat light-emitting surface (second lateral surface 12). In the transmission grating 100, light 50 incident on the first light-transmissive region 10 through the flat light-incident surface 30 is reflected at the first light-reflecting interface 27 and emitted from the flat light-emitting surface 40, and diffraction light occurs in the direction where the reflected light emitted from the flat light-emitting surface 40 satisfies the diffraction condition for $m^{th}$-order (i.e., the difference in optical paths is an integer multiple (m times) of wavelength). In the first embodiment, the diffracted light is assumed to be emitted from the flat light-emitting surface 40 into a vacuum. When $d(\sin \alpha - \sin \beta m) = m\lambda$, where $m \neq 0$ is satisfied in a vacuum, the intensity of the $m^{th}$-order transmitted diffracted light increases. In the transmission grating 100, the first light-reflecting interfaces 27 are also provided, aiming to eliminate straight forward propagation of the incident light incident from the flat light-incident surface (the first surface 11 of the first light-transmissive region 10) so that zero-order transmitted diffracted light can be suppressed. In the transmission grating 100 of the first embodiment, it is preferable to set the thickness t of the transmission grating and the thickness $t_1$ of the first light-transmissive region so that light incident from the flat light-incident surface (the first lateral surface 11 of the first light-transmissive region 10) is not emitted from the flat light-emitting surface 40 as a zero-order transmitted diffracted light.

In the transmission grating 100, first-order diffracted light that has greater intensity than second or higher order diffracted light is preferably used, in which, the first light-reflecting interface 27 is preferably a flat surface similar to a mirror surface. More specifically, the light-reflecting interface preferably has a surface accuracy (in other words, a flatness or a flatness degree) of $\lambda/4$ or less, more preferably $\lambda/8$ or less. Because, the closer to a mirror surface, the larger reduction of scattering light, and which can reduce the second-order transmitted diffracted light.

Next, an example of the transmission grating of the first embodiment will be described, in which the zero-order transmitted diffracted light is reduced or eliminated and intensity of the first-order transmitted diffracted light is used. In the example shown below, description will be given mainly with reference to FIG. 3, on the case in which the first-order diffraction angle of transmitted light is zero. In the description below, a transmission grating according to the first embodiment using intensity of first-order transmitted diffracted light will be described, but the transmission grating according to the first embodiment can also be structured by using diffracted light of higher order such as a second-order or third-order diffracted light.

As illustrated in FIG. 3, when two adjacent incident lights enter the flat light-incident surface 30 at locations spaced apart from each other at a distance d that is a diffraction grating period, the difference in optical paths is $d \sin \alpha_0$. In the case of a transmission grating, the diffraction condition for first-order requires that the difference in optical paths is equal to the wavelength in the material the two adjacent incident lights propagate. The example shown in FIG. 3 satisfies the equation (3).

$$d \sin \alpha_0 = \lambda/n_0 \tag{3}$$

Further, in the present example, light reflected at the first light-reflecting interface 27 propagates in a direction perpendicular to the flat light-emitting surface 40 (i.e., $\beta_1=0$). Thus, the angle of refraction $\alpha_1$ is equal to twice the incident angle $\theta$ (i.e., $\alpha_1=2\theta$).

From the equations (1), (2), (3), and $\alpha_1=2\theta$, $\lambda$, n1, t1, t2 and $\theta$ satisfy the equation (4-1) or (4-2).

$$\lambda/(t_1+t_2)=2n_1 \sin \theta \tag{4-1}$$

or $$\theta=\arcsin(\lambda/2n_1(t_1+t_2)) \tag{4-2}$$

As described above, by alternatively stacking the first light-transmissive region 10 having a thickness of $t_1$ and the second light-transmissive region 20 having a thickness of $t_2$ at an inclination angle $\theta$ that satisfies the equation (4-1) or (4-2), the transmission grating 100 that can enhance the intensity of first-order transmitted diffracted light 61 can be obtained.

Next, the thickness t of the transmission grating 100 will be described with reference of FIG. 4.

If the thickness t of the transmission grating 100 is too small, the amount of zero-order transmitted diffracted light, that is, the amount of the incident light that is not reflected at the first light-reflecting interface 27 but is transmitted through the first light-transmissive region 10 will increase. Therefore, the thickness t of the transmission grating 100 is preferably set so as not increase the amount of zero-order transmitted diffracted light. More specifically, in order to reduce or eliminate light transmit through the first light-transmissive region 10 without being reflected at the first light-reflecting interface 27, the minimum value $t_{min}$ of the thickness t of the transmission grating 100 can be given in the equation (5).

$$t_{min}=t_1 \cos 2\theta/\sin \theta \quad (5)$$

Figure 4:
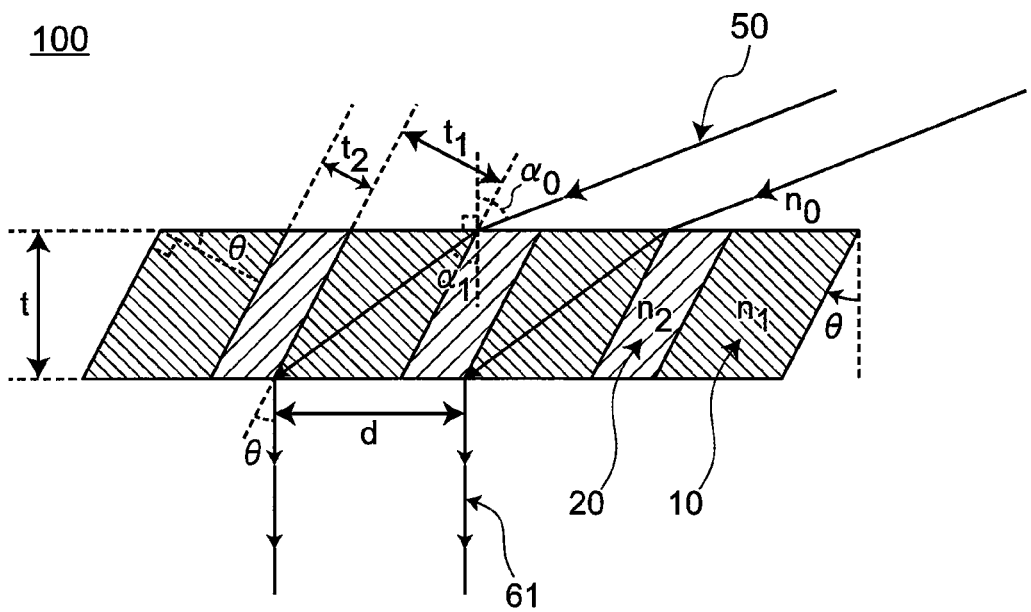
FIG. 4 is a diagram illustrating a minimum thickness of the transmission grating shown in FIG. 3.

FIG. 4 illustrates a schematic of the operation of the transmission grating 100 with the minimum thickness $t_{min}$. As shown in FIG. 4, when the thickness t of the transmission grating 100 is smaller than the minimum thickness $t_{min}$, a portion of the incident light may be transmitted through the first light-transmissive region 10 without being reflected at the light-reflecting interfaces.

Meanwhile, when the thickness t of the transmission grating 100 is too large, light reflected at the first light-reflecting interface 27 may propagate in the first light-transmissive region 10 and is reflected at the second light-reflecting interface 28 at the opposite side of the first light-reflecting interface 27, which increases the zero-order diffracted light. The second light-transmissive region 28 is the interface between a fourth lateral surface 14 of the first light-transmissive region 10 and a third lateral surface 23 of the second light-transmissive region 14. Reflection of light at the second light-reflecting interface 28 may increase optical loss such as scattering loss and therefore undesirable. The maximum value ($t_{max}$) of the thickness t of the transmission grating 100, which allows light reflected at the first light-first reflecting interface 27 to be transmitted from the flat light-emitting surface 40 without being reflected at the second light-reflecting interface 28 can be determined from the equation (6).

$$t_{max}=t_1/\sin \theta \quad (6)$$

Figure 5:
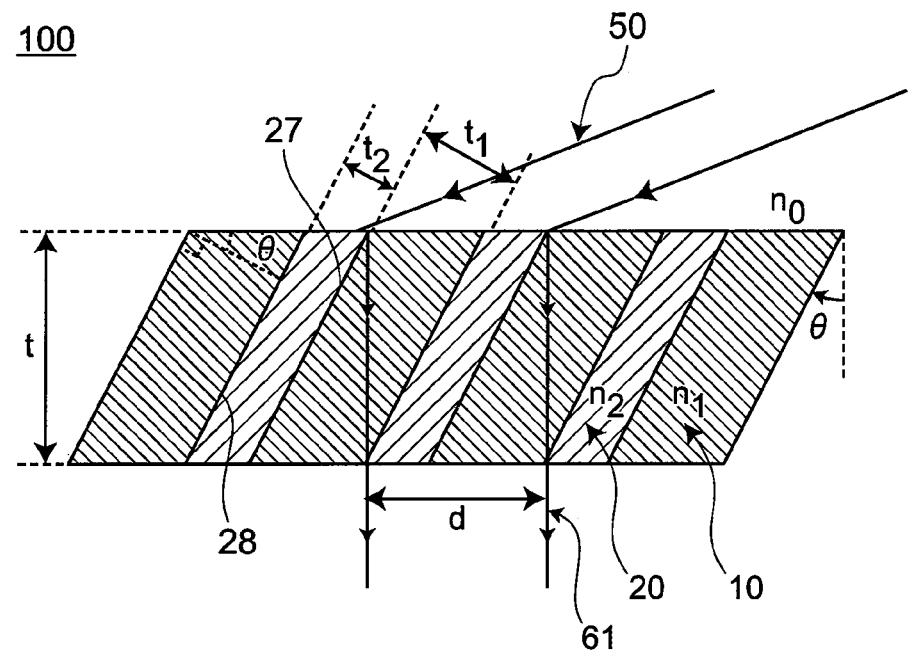
FIG. 5 is a diagram illustrating a maximum thickness of the transmission grating shown in FIG. 3.

FIG. 5 illustrates a schematic of the operation of the transmission grating 100 with the maximum thickness $t_{max}$. As shown in FIG. 5, when the thickness t of the transmission grating 100 is larger than the maximum thickness $t_{max}$, light may be reflected at the second light-reflecting interface 28.

As can be seen from the description above, the thickness t of the transmission grating 100 preferably satisfy the relation of (7)

$$t_1 \cos 2\theta/\sin \theta < t < t_1/\sin \theta \quad (7)$$

As described above, when the transmission grating 100 has a thickness t that satisfies the equation (7), incident light to the first light-transmissive region 10 can be reflected at the first light-reflecting interface 27 and transmitted from the flat light-emitting surface 40 without being reflected at the second light-reflecting interface 28, and further, transmission of zero-order transmitted diffracted light from the flat light-emitting surface 40 can be controlled. Accordingly, a transmission grating of high diffraction efficiency, capable of diffracting only first-order transmitted diffracted light can be formed.

The transmission grating 100 having such a structure as described above can be produced by, for example, alternatively stacking a plurality of transparent plates (thickness $t_1$) of a high-refractive index ($n_1$) for the first light-transmissive regions 10 and a plurality of transparent plates (thickness $t_2$) of a low-refractive index ($n_2$) for the second light-transmissive regions 20, joining them to form a stacked-plate structure, then, tilting the stacked-plate structure at an angle θ, which satisfies the equation (4-1) or (4-2), with respect to the line normal to the plane, cutting the tilted stacked-plate structure in the normal direction and at two parallel planes having a distance satisfying the equation (6) that is approximately the maximum thickness $t_{max}$, then polishing to a thickness t satisfying the equation (7). More specific method of producing such a transmission grating 100 will be described further below.

Next, the thickness t of the transmission grating 100, the thickness $t_1$ of the first light-transmissive region 10, and the thickness $t_2$ of the second light-transmissive region 20 will be described in detail.

When the tilting angle θ is in a range of 0≤θ<45°, the maximum thickness $t_{max}$ of the thickness t of the transmission grating 100 monotonically decreases as the tilting angle θ increases, as indicated in the equation (8). Equation (8) is obtained by substituting the formula given in (4-2) into the formula given by (6).

$$t_{max}=2n_1 t_1(t_1+t_2)/\lambda \quad (8)$$

The equation (8) indicates that when a wavelength λ and a high refractive index n1 of the incident light 50 are given, the greater the value of $t_1(t_1+t_2)$, the greater the thickness t can be. With a greater thickness t, mechanical strength of the transmission grating 100 can be increased. However, when the sum of the thicknesses ($t_1+t_2$) of the first light-transmissive region 10 and the second light-transmission region 20 is too large, the number of allowed diffraction orders increases, which would increase stray light. Accordingly, in the transmission grating 100 of the first embodiment, a greater value of $t_1(t_1+t_2)$ is preferable within a range where the incident angle $\alpha_0$ satisfying $\alpha_0>30°$.

Next, the incident angle $\alpha_0$ will be described. The equations (1) and (3) and the diffraction condition lead to the equation (9).

$$\sin \beta_m=(1-m)\lambda \cos \theta/n_0(t_1+t_2) \quad (9)$$

Also, from the relationship: $|\sin \beta_m|\leq 1$, the relationship (10) is given.

$$-1\leq(1-m)\lambda \cos \theta/n_0(t_1+t_2)\leq 1 \quad (10)$$

Because $|\cos \theta|\leq 1$, the equation (10) indicates that the greater value of ($t_1+t_2$), a wider range of values that m is allowed. That is, the more orders of diffraction are allowed. The use of a diffraction grating that allows multiple orders of diffraction in a light source device would increase the amount of light that does not involve the optical output of the light source device. Therefore, setting of ($t_1+t_2$) too great in value is not desirable.

For this reason, for example, the incident angle $\alpha_0$ is preferably set in a range satisfying the inequality (11).

$$0.5<\lambda \cos \theta/n_0(t_1+t_2)=\sin \alpha_0 \quad (11)$$

When the inequality (11) is satisfied, the integers m allowed in the relationship (10) are limited to 0, 1, and 2, which give the diffraction angles of $\alpha_0$, 0, and $-\alpha_0$, respectively. Accordingly, the incident angle $\alpha_0$ is preferably set to satisfy the relationship (11), that is, to set in a range of $90°>\alpha_0>30°$.

Next, incident light to the transmission grating 100 will be illustrated using a linearly polarized laser light such as laser light emitted from an edge-emitting semiconductor laser. When a p-polarized light is incident on the transmission grating 100 from a space with a refractive index of $n_0$, the reflectance at the interface between the space of the refractive index $n_0$ and the first light-transmissive region 10 becomes zero at a certain angle of incidence (i.e., Brewster's angle $\theta_B$). In this case, the incident angle $\alpha_0$ is more preferably set in a range of $30° \le \alpha_0 \approx \theta_B$. Because, the incident angle $\alpha_0$ greater than Brewster's angle $\theta_B$ leads to a rapid increase in the amount of light reflected at the interface between the space of the refractive index $n_0$ and the first light-transmissive region 10 (i.e., a first lateral surface 11 of the first light-transmissive region 10 in the flat light-incident surface. The incident angle $\alpha_0$ is further preferably set to Brewster's angle $\theta_B$. Because, with this angle, reflection of light at the first lateral surface 11 of the first light-transmissive region 10 in the flat light-incident surface is eliminated, and thus, a reduction in the zero-order reflected and diffracted light can be obtained. That is, of the light reflected from the interface between the space of the refractive index $n_0$ and the first lateral surfaces 11, 21 of the first light-transmissive region 10 (i.e., the first lateral surface 11 of the first light-transmissive region 10) is eliminated, and the light reflected from the interface between the space of the refractive index $n_0$ and the second light-transmissive region 20 (i.e., the first lateral surface 21 of the second light-transmissive region 20) remain. Brewster's angle $\theta_B$ is defined by the equation (12).

$$\tan \theta_B = n_1/n_0 \quad (12)$$

When $n_0 = 1$, then $\theta_B > 45°$, where $\theta_B = \alpha_0 > 30°$ is always satisfied. Thus, the number of allowed diffraction orders can be limited to 0, 1, and 2.

When $\alpha_0 = \theta_B$, from the equations (2), (12), and $\alpha_1 = 2\theta$, the relationship between $n_0$, $n_1$, and $\theta$ satisfy the equation (13).

$$\theta = \arcsin(\cos(\arctan(n_1/n_0)))/2 \quad (13)$$

From the equations (13) and (7), the thickness t of the transmission grating 100 satisfies the relationship (14). Further, when a wavelength $\lambda$ is given, the equations (13) and (4-1) give the equation (15).

$$t_1 \sin(\arctan(n_1/n_0))/\sin(\arcsin(\cos(\arctan(n_1/n_0)))/2) < t < t_1/\sin(\arcsin(\cos(\arctan(n_1/n_0)))/2) \quad (14)$$

$$t_1 + t_2 = \lambda/2n_1 \sin(\arcsin(\cos(\arctan(n_1/n_0)))/2) \quad (14)$$

When the first light-transmissive regions 10 each having a thickness of $t_1$ and the second light-transmissive regions 20 each having a thickness of $t_2$, satisfying the relation (14) are alternatively stacked at a tilting angle $\theta$ satisfying the equation (13) to structure the transmission grating 100 whose thickness t satisfying the relationship (14), the transmission grating 100 has a diffraction grating period of $\lambda/n_1 \cos(\arctan(n_1/n_0))$. When a p-polarized light is incident at Brewster's angle $\theta_B$ on the transmission grating 100 structured as described above, zero-order reflected and diffracted light and zero-order transmitted diffracted light can be reduced, and third or higher-order diffracted light can be eliminated, whereas the intensity of the first-order transmitted diffracted light 61 can be enhanced.

The reflectance of light with an incident angle smaller than Brewster's angle $\theta_B$ gives a smaller reflectance. Thus, if the incident angle $\alpha_0$ is cannot be set to Brewster's angle $\theta_B$, an incident angle that is smaller than Brewster's angle $\theta_B$ is preferably selected. When the incident angle $\alpha_0$ is smaller than Brewster's angle $\theta_B$, using a known method to form an antireflection layer of a single-layer or multilayer dielectric film on the flat light-incident surface of the transmission grating can reduce the reflected and diffracted light.

When a s-polarized light is incident from the space of the refractive index $n_0$ on the transmission grating 100, an incident angle that gives a reflectance of zero is not present. In this case, an increase of the incident angle $\alpha_0$ leads to a monotonic increase of the reflectance at the side surface 11 of the first light-transmissive region. Thus, the incident angle $\alpha_0$ is preferably set to slightly greater than 30°.

Next, the high refractive index $n_1$, the low refractive index $n_2$, and the tilting angle $\theta$ will be discussed. The incident angle to the first light-reflecting interface 27 can be expressed as $90° - \alpha_1 + \theta$. When $\alpha_1 = 2\theta$, the incident angle is $90° - \theta$.

Because $n_2 < n_1$, there is a critical angle $\theta_c$ of incidence. When the incident angle to the first light-reflecting interface 27 is greater than the critical angle $\theta_c$, the incident light is totally internally reflected. When the equation (16) is satisfied, total internal reflection takes place. Thus, zero-order transmitted diffracted light can be reduced and the intensity of the first-order transmitted diffracted light 61 can be enhanced, and therefore preferable.

$$90° - \theta > \theta_c = \arcsin(n_2/n_1) \quad (16)$$

That is, the smaller the tilting angle $\theta$, the larger the selection of materials for the first light-transmissive region 10 and the second light-transmissive region 20 that satisfy the conditions for total internal reflection. Also, the smaller $n_2/n_1$, the smaller the critical angle $\theta_c$, allowing a wider range of tilt angle $\theta$ that allows total internal reflection, and therefore preferable. The refractive index of the gas is smaller than the refractive index of the liquid or the solid, therefore, a gas is preferably used as the second transparent material. Because, the refractive index $n_2$ of the second transparent material can be closer the smallest value of 1. When a gas is used as the second transparent material, the first light-transmissive regions of a first transparent material are arranged at an interval of $t_2$, providing intervening second regions, and a gas is filled in the intervening second regions. In conditions of total internal reflection at the first light-reflecting interface 27, evanescent light is generated at the interface 27 and penetrate into the second light-transmissive region 20. The penetration depth D of the evanescent light into the second light-transmissive region 20 is expressed by the equation (17).

$$D = \lambda/4\pi((n_1 \sin(90° - \theta))^2 - n_2^2)^{1/2} \quad (17)$$

When $\theta = 0°$, the depth D is the minimum value of $\lambda/4\pi (n_1^2 - n_2^2)^{1/2}$. When the thickness $t_2$ of the second light-transmissive region 20 is smaller than the penetration depth D, light propagates through the second light-transmissive region 20 into the adjacent first light-transmissive region 10, resulting in a decrease in the intensity of the first-order transmitted diffracted light 61 and an increase in the optical loss due to zero-order transmitted diffracted light and interface scattering. Thus, the thickness $t_2$ of the second light-transmissive region 20 is preferably greater than $\lambda/4\pi(n_1^2 - n_2^2)^{1/2}$. For the transmission gratings designed for visible light or infrared, the wavelength $\lambda$ is 0.4 μm or greater. Therefore, the thickness $t_2$ of the second light-transmissive region 20, in μm, is preferably greater than $0.1/\pi (n_1^2 - n_2^2)^{1/2}$. Further, when a gas is used as the second transparent material, $n_2^2 \approx 1$, and thus the thickness $t_2$ of the second light-transmissive region 20, in μm, is preferably greater than $0.1/\pi n_1^2$. When $\alpha_1 = 2\theta$, the smaller the tilt angle $\theta$, the smaller the penetration depth D. Thus, light propagates in the second light-transmissive region 20 can be reduced, which increase the intensity of the first transmitted diffracted light 61, and thus preferable. Further, the higher the refractive index $n_1$ of the first light-transmissive region 10, the smaller the penetration depth D, and therefore preferable. For visible light or infrared, various kinds of optical glasses can be suitably used as the first and second transparent materials.

Next light incident on the first lateral surfaces 21 of the second light-transmissive regions 20 that constitute portions of the flat light-incident surface will be discussed. The angle of refraction $\alpha_2$ incident on the first lateral surface 21 of the second light-transmissive region 20 satisfies the equation (18) according to Snell's Law.

$$n_2 \sin \alpha_2 = n_0 \sin \alpha_0 \tag{18}$$

Because $n_2 < n_1$, there is no critical angle $\theta_c$. When $\alpha_2 > \alpha_1$, the incident angle to the second light-reflecting interface 28 is smaller than $90° - \theta$. Compared to the case where light incident on the first lateral surface 11 of the first light-transmissive region 10 is incident on the first light-reflecting interface 27, the second light-reflecting interface 28 exhibits lower reflectance and higher transmittance. The angle of light exiting from the flat light-emitting surface of the transmission grating, after being incident on the first lateral surface 21 of the second light-transmissive region 20 and is reflected once at the second light-reflecting interface 28, is not zero. Thus, light incident on the first lateral surface 21 of the second light-transmissive region 20 does not satisfy the conditions for diffraction, and thus does not increase first-order transmitted diffracted light 61. Also, when light is incident on the first lateral surface 21 of the second light-transmissive region 20 and is transmitted and diffracted through the second light-transmissive region 28, first-order transmitted diffracted light 61 is not generated. That is, light incident on the first lateral surface 21 of the second light-transmissive region 20 becomes stray light that results in optical loss. For this reason, in order to reduce light incident on the first lateral surface 21 of the second light-transmissive region 20, a smaller $t_2/t_1$ is preferable. Whereas, $t_2$ is greater than $\lambda/4\pi(n_1^2 - n_2^2)^{1/2}$.

Next, the reflectance R of light perpendicularly incident on the second lateral surface 12 of the first light-transmissive region 10 will be described. The reflectance R can be given by (19) below.

$$R = (n_1 - n_0)^2 / (n_1 + n_0)^2 \tag{19}$$

That is, the second lateral surface 12 of the first light-transmissive region 10 serves as a partially transmissive mirror having a reflectance of R, given by the equation (19). Further, providing a dielectric multilayer film or a dielectric single film on the flat light-emitting surface of the transmission grating 100 allows adjusting the reflectance of the flat light-emitting surface of the transmission grating 100. For example, by adjusting the reflectance of the flat light-emitting surface of the transmission grating 100, the flat light-emitting surface of the transmission grating 100 can be used in place of the partially transmissive mirror (partially reflecting mirror, retroreflective mirror) of WBC (wavelength beam combining) system shown in FIG. 5 of "Laser Beam Combining for High-Power High-Radiance Sources" T. Y. Fan, IEEE Journal of Selected Topics in Quantum Electronics, Vol. 11, No. 3, May/June 2005, pp. 567-577. This can lead to a reduction of the number of components of a laser light source device, stabilizing the positional relationship between the wavelength dispersive element and the partially reflecting mirror, and reducing time-dependent change, which can contribute to improvement in the reliability of the WBC laser light source devices. The reflectance of the partially transmissive mirror is an important factor for the performance and reliability of the WBC laser light source devices. Because, the reflectance of the partially transmissive mirror determines the feedback quantity of light to the laser element, and stability of oscillation wavelength of the laser element. Adjusting of the reflectance of the dielectric multilayer film or dielectric single layer can be performed by using a known film deposition method.

Figure 6:
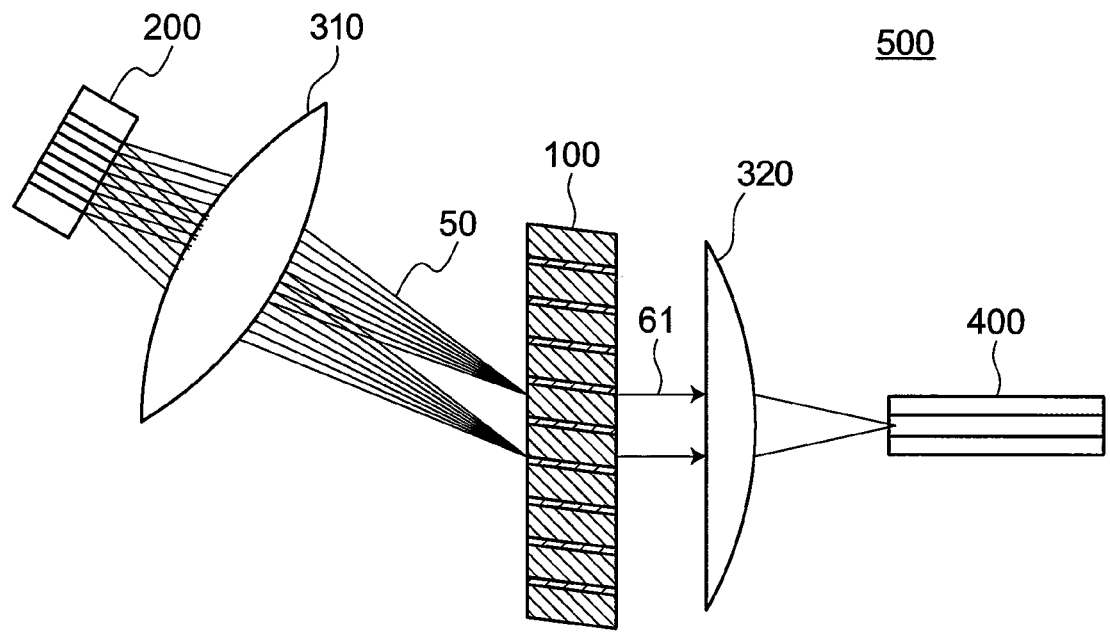
FIG. 6 is a schematic diagram of a laser light source device using the transmission grating of the first embodiment.

FIG. 6 is a schematic diagram of a WBC laser light source device using the transmission grating 100 of the first embodiment. In the laser light source device shown in FIG. 6, a laser array 200 and an incident-side optical system (collimating lens) 310 are arranged at the flat light-incident surface side of the transmission grating 100, and a light-emitting side optical system (condensing lens) 320 and an output optical fiber 400 are arranged at flat light-emitting surface side of the transmission grating 100.

In the laser light source device 500 shown in FIG. 6, the back end surface of the laser array 200 and the transmission grating 100 constitute an external resonator. Laser array 200 is configured to emit a plurality of laser lights having different wavelengths $\lambda_i$ (i is an integer) with a predetermined divergence angle. Divergence angle of each laser light of the different wavelengths $\lambda_i$ is reduced through the light-incident side optical system (collimate lens) 310 to a divergence angle of substantially zero to cause light ray groups. Each of the laser lights of different wavelengths $\lambda_i$ in the light ray groups is incident on the flat light-incident surface of the transmission grating 100 at an incident angle of $\alpha_i$. The refractive index n of the space, the diffraction grating period d, the wavelength $\lambda_i$, and the incident angle $\alpha_i$ satisfy the relationship $d \sin \alpha_1 = \lambda_i/n$. That is, light ray groups having a wavelength $\lambda_i$ and incident on the transmission grating 100 at an incident angle $\alpha_1$ are superposed through the transmission grating 100 and are emitted perpendicularly from the flat light-emitting surface. The light ray groups emitted from the flat light-emitting surface are condensed on an end surface of an output optical fiber 400 by the light-emitting side optical system (condensing lens) 320. At this time, second-order reflected and diffracted light of each of the laser lights of the light ray group having a wavelength each of the laser lights and incident on the transmission grating 100 at an incident angle $\alpha_i$ is reflected in the reverse direction of the incident direction (retroreflective reflection). That is, the transmission grating 100 and the back end surface of the laser array 200 constitute a resonator structure. With the resonator structure (external resonator structure) as described above, reliability of WBC laser light source devices can be improved. Change in the temperature of the laser array 200 during its operation may change the wavelength $\lambda_i$. Also, heat generated during the operation, and/or change in time may change the incident angle $\alpha_i$. However, with the external resonator structure as described above, such a change in the wavelength $\lambda_i$ can be reduced, and a change in the incident angle $\alpha_i$ leads to retroreflective reflection, which contribute to improving the stability of laser output power.

In order to realize higher optical output power with a laser light source device, an increase in the number of constituting components of the laser light source such as increasing the number of laser arrays, providing a polarizing prism to create a polarized wave, may be required. However, with the use of the transmission grating 100 according to the first embodiment, constituting components can be arranged separately at the flat light-incident surface side and the flat light-emitting surface side of the transmission grating 100, allowing easier placement of the constituting components compared to that with the use of a reflection grating, and thus suitable for higher optical output power of the laser light source device.

Next, variational examples according to the first embodiment will be described.

Variational Example 1

The transmission grating 100 according to the first embodiment, operating at visible light wavelengths have a thickness t, for example, in a range of about 0.84 µm to about 1.87 µm, when the first transparent material is a glass having a refractive index 1.51, and the second transparent material is the air, and light having a wavelength 0.5 µm is incident at an angle of 56.5°. When the thickness t of the transmission grating 100 is too small to have sufficient mechanical strength, a plate made of a transparent material and having substantially uniform thickness is preferably joined to the flat light-incident surface or the flat light-emitting surface of the transmission grating 100.

Figure 7:
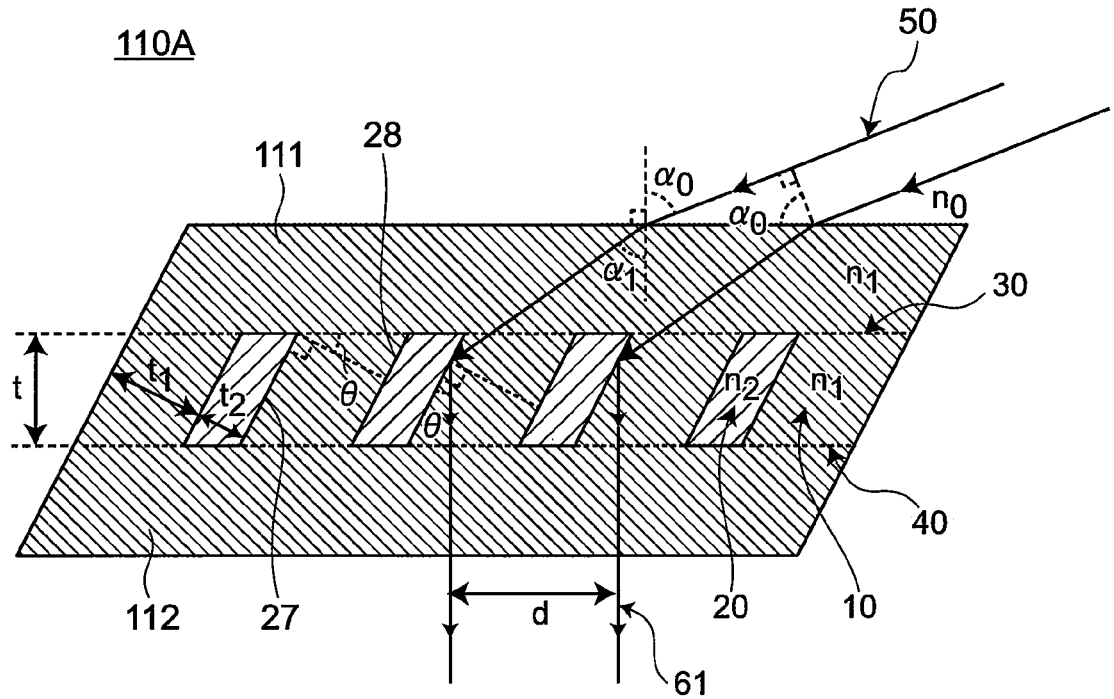
FIG. 7 is a schematic diagram of a cross-section of a transmission grating according to a variational example 1 of the first embodiment.

As shown in FIG. 7, the transmission grating 110A according to the variational example 1 has a configuration similar to that of the transmission grating 100 according to the first embodiment, except that a plate made of a transparent material and having a refractive index of $n_1$ is provided to the flat light-incident surface and the flat light-emitting surface of the transmission grating 100. More specifically, a first light-transmissive plate 111 having a refractive index of $n_1$ is integrally connected to the flat light-incident surface 30, and a second light-transmissive plate 112 having a refractive index of $n_2$ is integrally connected to the flat light-emitting surface plane 40 of the transmission grating 100 corresponding to the first embodiment. The bonding can be carried out by employing a known bonding method such as adhesion or welding, using a transparent adhesive. Further, a dielectric multilayer film or a dielectric single film can be disposed on the outer surface (i.e., the surface that is opposite side of the surface bonded to the transmission grating 100) of the second light-transmissive plate 112, to provide a predetermined partially transmissive mirror. The first light-transmissive region 10, the first light-transmissive plate 111, and the second light-transmissive plate 112 may be produced in one body as described further below, instead of the method as described above, in which after the transmission grating 100 according to the first embodiment is provided, the first light-transmissive plate 111 is bonded to the flat light-incident surface 30 and the second light-transmissive plate 112 is bonded to the flat light-emitting surface 40.

In the transmission grating 110A according to the variational example 1, the first light-transmissive region 10 and the first light-transmissive plate 111 have the same refractive index, which can substantially eliminate reflection at the interface between the first light-transmissive region 10 and the first light-transmissive plate 111 in the flat light-incident surface 30, and can also increase mechanical strength of the transmission grating 110A.

As shown in FIG. 7, the diffraction conditions are the same in the transmission grating 110A according to the variational example 1 and in the transmission grating 100 according to the first embodiment.

Variational Example 2

Figure 8:
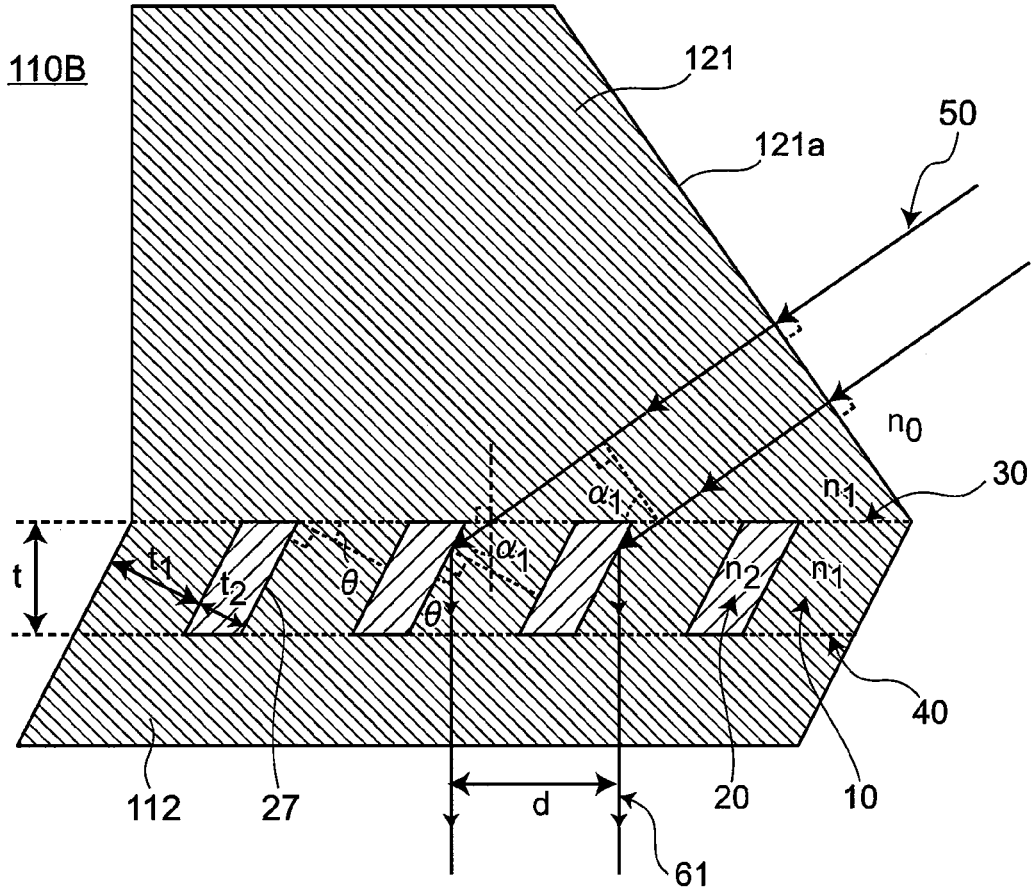
FIG. 8 is a schematic diagram of a cross-section of a transmission grating according to a variational example 2 of the first embodiment.

As shown in FIG. 8, the transmission grating 110B according to the variational example 2 has a configuration similar to that of the transmission grating 110A of the variational example 1 except that a wedge prism 121 made of a transparent material having a refractive index $n_1$ is used in place of the first light-transmissive plate 111. More specifically, the wedge prism 121 made of a transparent material having a refractive index $n_1$ is bonded to the flat light-incident surface of the transmission grating 100. The bonding can be carried out in a similar manner as in the variational example 1, by employing a known bonding method such as adhesion or welding, using a transparent adhesive. Similarly to that in the variational example 1, the transmission grating 110B of the variational example 2 as described above has increased mechanical strength, and moreover, reflection of light can be reduced.

That is, in the transmission grating 11B of the variational example 2, by designing the tilting angle of the light-incident surface 121a of the wedge prism 121, the incident angle to the wedge prism 121 can be set to 0° or Brewster's angle $\theta_B$. FIG. 8 illustrates an example where the incident angle to the wedge prism 121 is set to 0°. It is preferable that the transmission grating 110B of the variational example 2 further includes an antireflection film on the light-incident surface 121a of the wedge prism 121, thus a further reduction in loss due to unintentional reflection can be obtained.

As shown in FIG. 8, in the transmission grating 110B of the variational example 2, the optical path difference between two beams of light incident on the flat light-incident surface 30 at a distance of the diffraction grating period d is d sin α. Because the wavelength in a transparent material of refractive index $n_1$ is $\lambda/n_1$, the conditions for the first-order diffraction to produce first-order transmitted diffracted light is expressed in the equation (20).

$$d \sin \alpha_1 = \lambda/n_1 \qquad (20)$$

Because the equation (2) described in the first embodiment is based on Snell's law, the equation 20 is equivalent to the equation (3). Therefore, $\lambda$, $n_1$, $t_1$, $t_2$, and $\theta$ satisfy the equation (4-1) or (4-2).

Second Embodiment

Figure 9A:
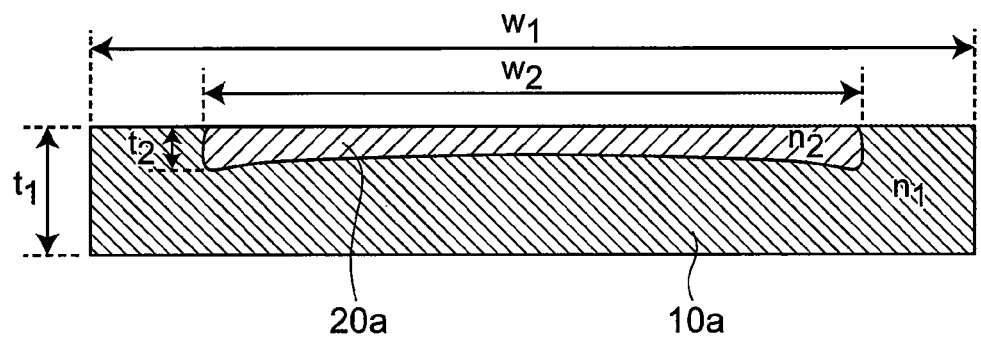
FIG. 9A is a schematic diagram of a cross-section of a portion of a transmission grating according to a second embodiment.
Figure 9B:
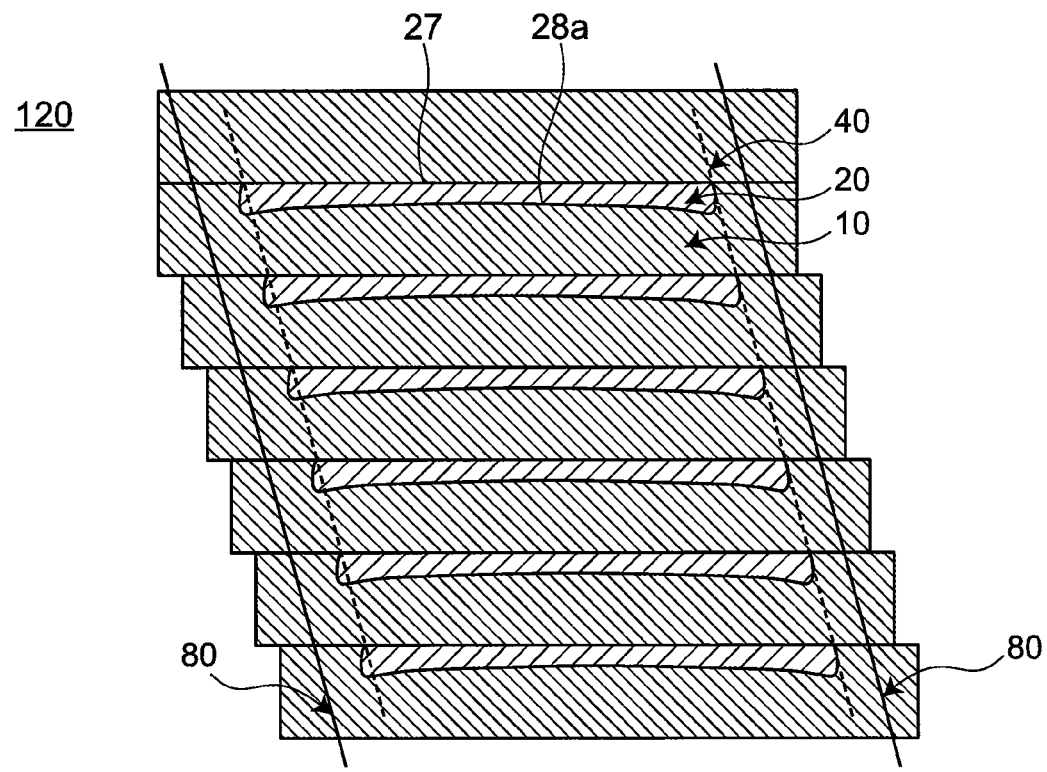
FIG. 9B is a schematic diagram of a cross-section of a part of the transmission grating according to the second embodiment.

The transmission grating 120 according to the second embodiment has a similar configuration as that of the transmission grating 110A of the variational example 1 of the first embodiment, except that as shown in FIG. 9B, the second light-reflecting interface 28a has a curved surface in the transmission grating 120 according to the second embodiment, while the second light-reflecting interface 28 has a flat surface in the transmission grating 110A of the variational example 1 of the first embodiment. The shape of the second light-reflecting interface 28a does not affect the basic diffraction condition, which allows wider choice of the shape of the second light-reflecting interface 28a, such as a curved surface as described above, accordingly wider choice is allowed for the method to produce the transmission gratings according to certain embodiments of the present disclosure.

The transmission grating 120 according to the second embodiment can be produced as below, for example. A plurality of plates are provided, in each of which, as shown in FIG. 9A, the second transparent material 20a having a lower refractive index ($n_2$) that serves as the second light-transmissive region 20 is filled in a pre-determined recess of the first transparent plate 10a having a higher refractive index ($n_1$) that serves as the first light-transmissive region 10, and then, the surface is polished to obtain a flat surface. Then, the plurality of plates are stacked to form a stacked structure as shown in FIG. 9B, and the stacked structure is cut by two predetermined parallel planes 80. The materials described in the first embodiment can also be used for the first transparent plates 10a and the second transparent regions 20a.

More specifically, the transmission grating 120 according to the second embodiment can be produced as described below.

With the use of a first transparent material having a high refractive index ($n_1$), a plurality of first transparent plates 10a each having a width $w_1$ and a thickness $t_1$ and being configured to serve as the first light-transmissive region 10 are provided, and at least one groove (width $w_2$, depth $t_2$) is formed in a first surface of each of the first transparent plates 10a.

Subsequently, a plurality of second transparent material 20a having a low refractive index ($n_2$) is filled in the at least one groove to serve as the second light-transmissive region 20. The surface of the second transparent material 20a filled in the at least one groove may be ground or polished if needed so that the surface of the second transparent material 20a and the first surface of the first transparent plate 10a are coplanar, as shown in FIG. 9A. A plural number of the first transparent plates 10a having the second transparent material 20a as described above are provided.

Subsequently, the plurality of first transparent plates 10a are stacked such that first ends of the second transparent materials 20a are coplanar with an intended flat light-incident surface, and the second ends of the second transparent materials 20a are coplanar with an intended flat light-emitting surface, then, fused to form a stacked structure of the first transparent plates 10a.

Then, the stacked structure of the first transparent plates 10a is cut by two planes 80 that are parallel to and located outer side with respect to the intended flat light-incident surface 30 and the intended flat light-emitting surface 40, as shown in FIG. 9B.

According to the transmission grating 120 and the method of producing the transmission grating 20 as described above, various types of transmission gratings can be produced by appropriately setting the thickness $t_1$ of the first transparent plates 10a, the depth of the grooves $t_2$, or the like, with respect to the wavelength λ of the diffracted light, while appropriately setting the high refractive index $n_1$ of the first transparent plates 10a and the low refractive index $n_2$ of the second transparent plates 20a. In the description above, the upper surface of the second transparent material 20a filled in the groove of the first transparent plate 10a is placed to create the first light-reflecting interface 27, but alternatively, the groove may be formed with a flat bottom and the bottom surface of the second transparent material 20a filled in the groove of the first transparent plate 10a is placed at the first light-reflecting interface side 27.

In the transmission gratings according to the embodiments, the smaller amount of reflection at the time of light incident on the first light-transmissive region 10, the more preferable, and thus a method for reducing the reflection has been described, for example in the first embodiment and the variational examples of the first embodiment. In the first embodiment and the variational examples of the first embodiment, it is further preferable to reduce the loss of light due to unintentional reflection at the first lateral surface 21 of the second light-transmissive region 20. As described above, when λ, $n_1$, $t_1$, $t_2$, and θ satisfy the relationship $0.5<\lambda \cos\theta/n_1(t_1+t_2)$, the number m of allowed diffraction orders is limited to 0, 1, and 2. The intensities of the reflected and diffracted light of m=0, 1, and 2 are affected by the shape of the first lateral surface 21 of the second light-transmissive region 20.

Figure 10A:
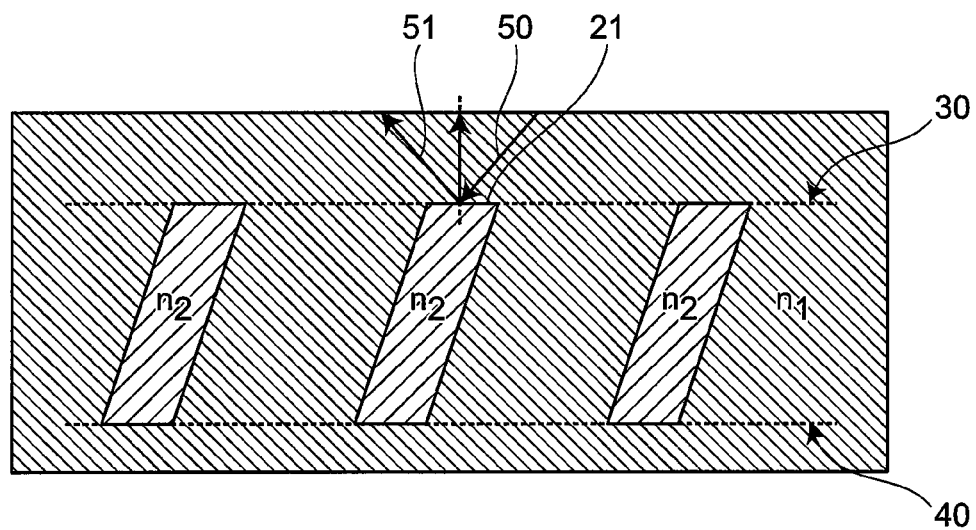
FIG. 10A is a schematic diagram illustrating a zero-order reflected and diffracted light in the transmission grating of variational example 1 of the first embodiment.

For example, in the configuration shown in FIG. 10A, the first lateral surfaces 21 of the second light-transmissive regions 20 are in parallel to the flat light-incident surface 30, thus, regular reflection (zero-order reflected and diffracted light 51) of the incident light 50 is enhanced.

Figure 10B:
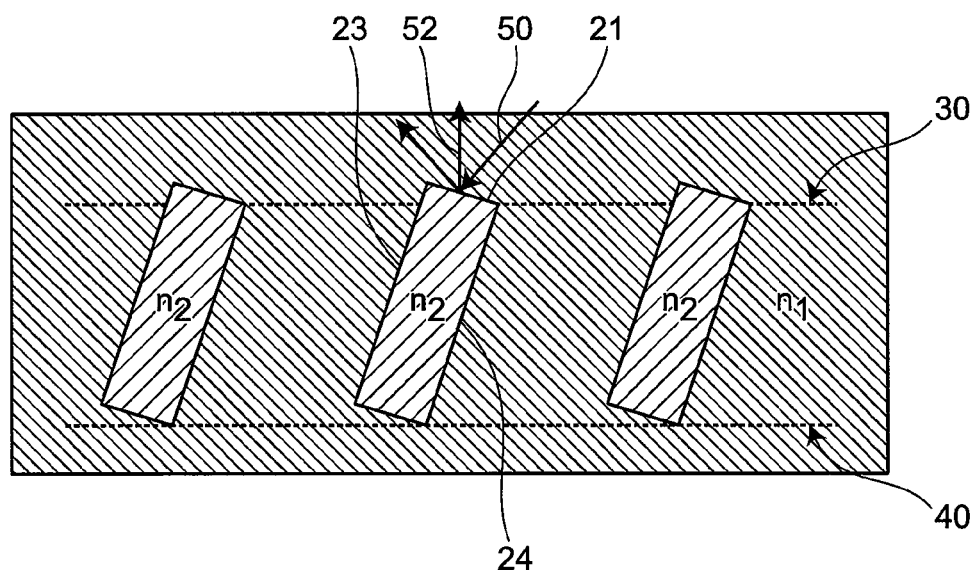
FIG. 10B is a schematic diagram of a cross-section illustrating a configuration to increase intensity of first-order reflected and diffracted light in the transmission grating of the variational example 1 of the first embodiment.

In the configuration shown in FIG. 10B, the first lateral surfaces 21 of the second light-transmissive regions 20 are perpendicular to the fourth lateral surfaces 24 or to the third lateral surfaces 23 of the second light-transmissive regions 20, which allows for enhancing the first-order reflected and diffracted light 52 that is perpendicular to the flat light-incident surface 30.

Figure 10C:
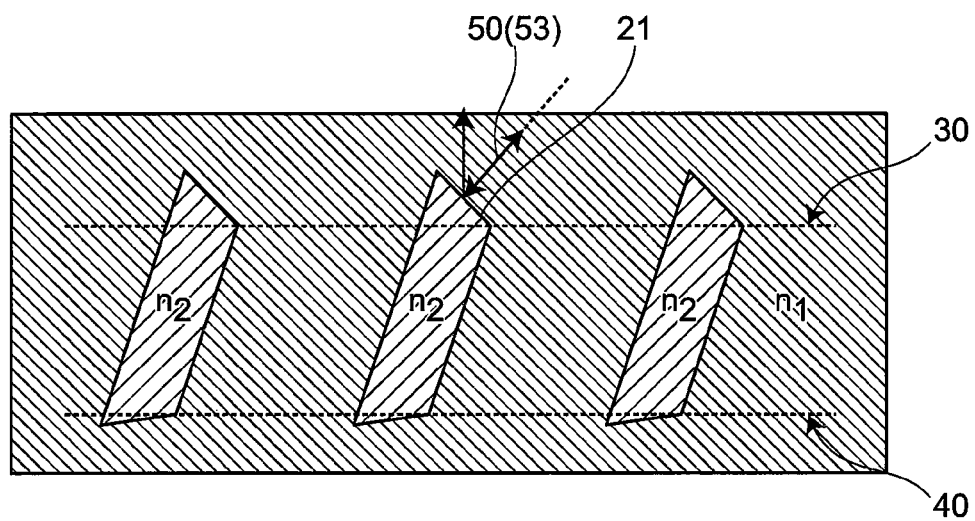
FIG. 10C is a schematic diagram of a cross-section illustrating a configuration to increase intensity of second-order reflected and diffracted light in the transmission grating of the variational example 1 of the first embodiment.

In the configuration shown in FIG. 10C, each of the first lateral surfaces 21 of the second light-transmissive region 20 is perpendicular to the incident light (that is, line normal to the first lateral surface 21 of the second light-transmissive region 20 is in parallel to the incident light), which enhances second-order reflected and diffracted light 53 that is reflected to the direction of the incident light. When the second-order reflected and diffracted light 53 that is reflected at the first lateral surface 21 of the second light-transmissive region 20 and return to the direction of the incident light has sufficient intensity, an antireflection film may be disposed on the surface at the outer side of the second light-transmissive plate 112 (refractive index $n_1$). When the distance between the surface at the outer side of the second light-transmissive plate 112 (refractive index $n_1$) and the flat light-incident surface 30 is an integer multiple of $\lambda/2n_1$, the phases of the reflected light from the surface at the outside of the second light-transmissive plater 112 (refractive index $n_1$) and the reflected light from the first lateral surface 21 of the second light-transmissive region 20 match with each other, further enhancing the second-order reflected and diffracted light 53.

In order to reduce the intensity of the zero-order and first-order reflected and diffracted light that will be resulting in optical loss, the first lateral surface 21 of the second light-transmissive region 20 shown in FIG. 10C is preferably perpendicular to the incident light.

Third Embodiment

A method of producing a transmission grating according to a third embodiment of the present invention will be described below.

The method of producing the transmission grating according to the third embodiment includes:

(a) providing two glass plates each having a plurality of elongated trapezoidal protrusions formed at an uniform intervals with intervening elongated reverse trapezoidal grooves of reverse trapezoidal shape in cross-section;

(b) engaging the elongated trapezoidal protrusions of one of the two glass plates with the elongated reverse trapezoidal grooves of the other of the two glass plate to fit the two glass plates to each other; and (c) closely fitting the walls of one side of the elongated trapezoidal protrusions with the walls of one side of the elongated reverse trapezoidal grooves, closely fitting the upper surfaces of the elongated trapezoidal protrusions with the bottom surfaces of the elongated reverse trapezoidal grooves, and bonding to each other.

The method of producing the transmission grating of the third embodiment will be described in detail below.

(a) Providing Glass Plates

Two glass plates 130 each having a first main surface 130a and a second main surface 130b located opposite to the first main surface are provided. The two glass plates 130 constitute the first light-transmissive regions of the transmission grating, and each glass plate has a high refractive index $n_1$. The glass plates may be made of an optical glass material such as a quartz glass, a borosilicate crown glass known as BK7.

Figure 11A:
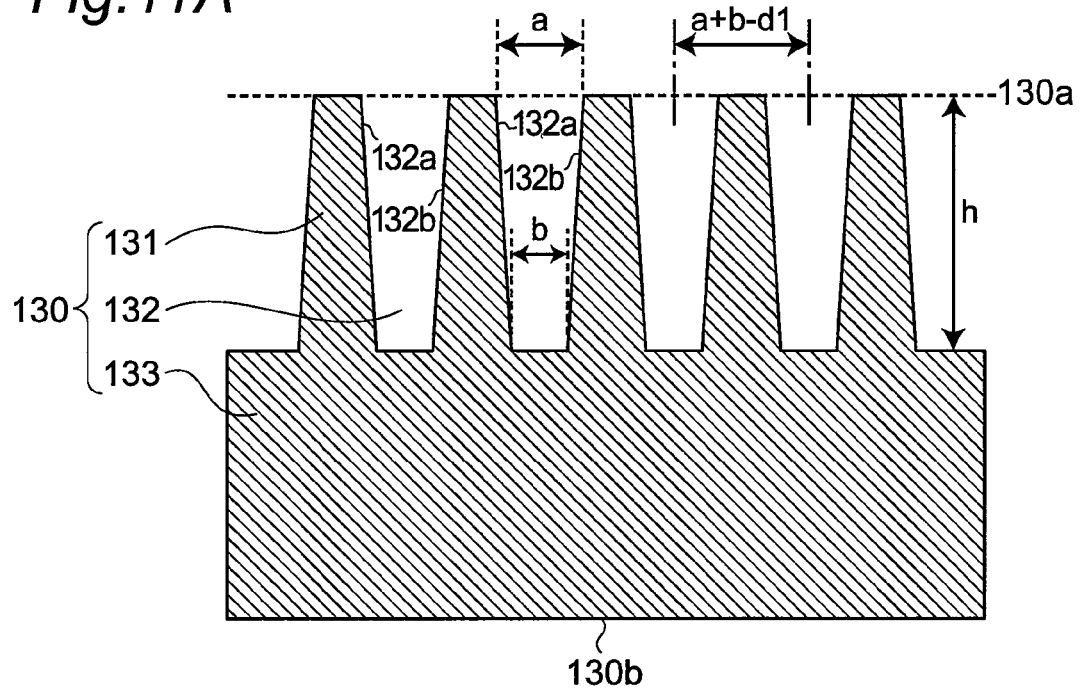
FIG. 11A is a schematic diagram of a cross-section of a glass plate formed with elongated trapezoidal protrusions in a method of producing a transmission grating according to a third embodiment of the present invention.

Subsequently, as shown in FIG. 11A, a plurality of elongated reverse trapezoidal grooves of reverse trapezoidal shape in a vertical cross-section, each defined by a first lateral surface, a second lateral surface, and a bottom surface, with an upper opening width a, a bottom width b, and a depth h, which hereinafter may be referred to as "elongated reverse trapezoidal groove(s)" or "reverse trapezoidal groove(s)," are formed in the first main surface 130a of each of the two glass plates provided as above. The plurality of elongated reverse trapezoidal grooves 132 are formed such that, as shown in FIG. 11A, the first walls 132a of the elongated reverse trapezoidal grooves are in parallel to one another and the second walls 132b of the elongated reverse trapezoidal grooves are in parallel to one another, where any two adjacent elongated reverse trapezoidal grooves are formed at an uniform interval of (a+b−d1). In the present specification, the term "an interval between two adjacent reverse trapezoidal grooves" refers to a distance between the longitudinal center lines (perpendicular to the vertical cross-section) each extending through the center of the opening of each of the reverse trapezoidal grooves 132. By forming the plurality of elongated reverse trapezoidal grooves 132 as described above, the elongated trapezoidal protrusions 131 are formed between any two of the adjacent reverse trapezoidal grooves 132. Each of the elongated trapezoidal protrusions 131 has an upper surface with a width b−d1, and a bottom surface with a width a−d1, the bottom surfaces of the elongated trapezoidal protrusions 131 are coplanar with the bottom surfaces of the reverse-trapezoidal grooves 132. In each of the glass plates 130, the base portion on which the strip-shaped protrusions 131 are provided is referred to as a "glass base portion 133".

The reverse trapezoidal grooves 132 can be formed by, for example, using a photolithography technique, disposing a metal mask having periodically arranged stripes on the first main surface 130a of the glass plates 130, and carrying etching. The etching of the glass plates 130 may be carried out by using a dry-etching device, for example. The shape of the reverse trapezoidal grooves 132, that is, the shape of the trapezoidal protrusions 131 can be adjusted by the shape of the metal mask and the conditions of etching, such as type of gas(es) and the flow rate(s) for dry etching, the etching pressure, RF power, or the like.

(b) Engaging

Figure 11B:
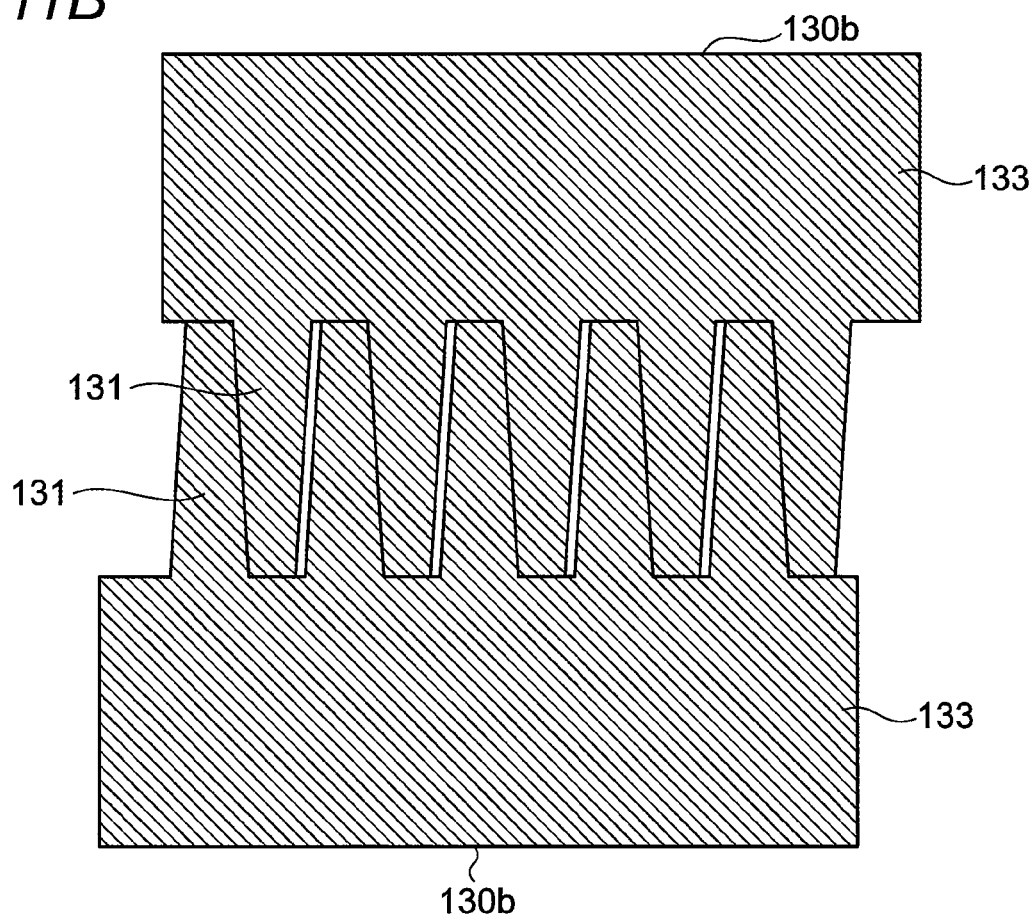
FIG. 11B is a schematic diagram of a cross-section illustrating two glass plates respectively formed with elongated trapezoidal protrusions are engaged to each other in the method of producing the transmission grating according to the third embodiment.

As shown in FIG. 11B, using two glass plates 130, the elongated trapezoidal protrusions 131 of one of the two glass plates 130 are engaged with the elongated reverse trapezoidal grooves 132 of the other of the two glass plates 130 to fit the two glass plates 130 to each other.

(c) Bonding

Subsequently, the first walls 132a of one of the two glass plates 130 are closely fit with the first walls 132a or the second walls 132b of the other of the two glass plates 130, and the upper surfaces of the trapezoidal protrusions 131 are closely fit with the bottom surfaces of the reverse trapezoidal grooves 132, and are bonded to each other. The bonding may be carried out by using, for example, a method such as pressure fusing, bonding (it is preferable to use an adhesive that has a refractive index equivalent to the refractive index of the glass plates 130), or direct joining, for example, surfaces that are subjected to a hydrophilic treatment are closely fit to join each other.

Figure 11C:
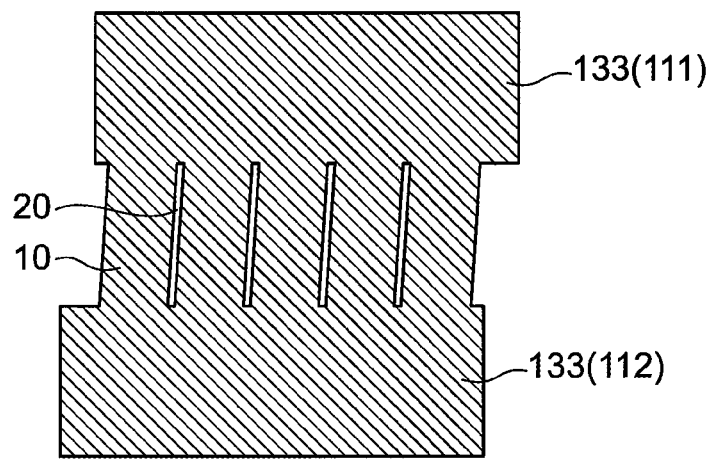
FIG. 11C is a schematic diagram of a cross-section illustrating two glass plates respectively formed with elongated trapezoidal protrusions and are engaged and fused to each other in the method of producing the transmission grating according to the third embodiment.

Accordingly, as shown in FIG. 11C, by joining the glass base portion 133 and the elongated trapezoidal protrusions 131 of the two glass plates 130 each other, and confining parallel air layers, the transmission grating of the variational example 1 having a glass structure of a single body similar to that of the transmission grating shown in FIG. 7 is produced. In the structure shown in FIG. 11C, the first light-transmissive regions 10 correspond to that in FIG. 7 are formed by fusing the trapezoidal protrusions 131 of the two glass plates into one body, and the portions correspond to second light-transmissive regions 20 in FIG. 7 are formed with air layers. In the method of producing the transmission grating according to the third embodiment, it is preferable that the surface at the incident side of the first light-transmissive plate 111 and the surface at the light emitting side of the second light-transmissive plate 112 are finish polished to form an antireflection film on each surface.

In the transmission grating 110A produced according to the method of the third embodiment, the second light-transmissive regions 20 are thin air layers tilted at an tilt angle θ corresponding to the shape of the reverse trapezoidal grooves (or the shape of the trapezoidal protrusions 131). The thickness of the air layers (i.e., the second light-transmissive regions 20) $t_2$ is d1 cos θ, and the diffraction grating period of the transmission grating is a+b−d1. The thickness $t_1$ of the first light-transmissive region 10 is (a+b−2d1)cos θ.

Fourth Embodiment

A method of producing a transmission grating according to a fourth embodiment of the present disclosure will be described below.

The method of producing the transmission grating according to the fourth embodiment includes:

(a) stacking a plurality of thin glass plates of a same thickness with a predetermined space between each two adjacent thin glass plates to obtain a multi-layered glass structure in which each two adjacent thin glass plates are facing each other across the space;

(b) fusing a glass on each side surface of the multi-layered glass structure to confine the spaces in the multi-layered glass structure;

(c) supporting the multi-layered glass structure containing the confined spaces by a glass support structure, at an upper surface, a lower surface, and two lateral surfaces opposite to each other with respect to a central axis that is parallel to the upper surface and the lower surface of the multi-layered glass structure;

(d) heating the multi-layered glass structure together with the glass support structure to collectively soften, and drawing the multi-layered glass structure and the glass support structure in a direction parallel to the central axis; and (e) cutting the drawn multi-layered glass structure and the glass support structure in a direction parallel to a second plane that is perpendicular to a first plane that includes the central axis and a stacking direction of the thin glass plates.

Next, with referring to FIG. 12A to FIG. 16A, the method of producing the transmission grating according to the fourth embodiment will be described in detail below.

(a) Stacking

A plurality of thin glass plates 141 having a refractive index m and a same thickness are stacked on a base glass plate 140*a* via a spacer with a predetermined space each other to obtain a multi-layered glass structure in which each two adjacent thin glass plates are facing each other across the space.

More specifically, a plurality of thin glass plates 141 each having a thickness T1 and a glass plate 140*a* having a greater dimensions than that of each of the thin glass plates 141 are provided.

A single thin glass plate 141 is superposed on the upper surface of the glass plate 140*a*. At this time, the thin glass plate 141 is superposed such that, for example, the central axis of the thin glass plate 141 is coaxial with the central axis of the upper surface of the glass plate 140*a*, to expose outer peripheral portion of the upper surface of the glass plate 140*a*.

Figure 12A:
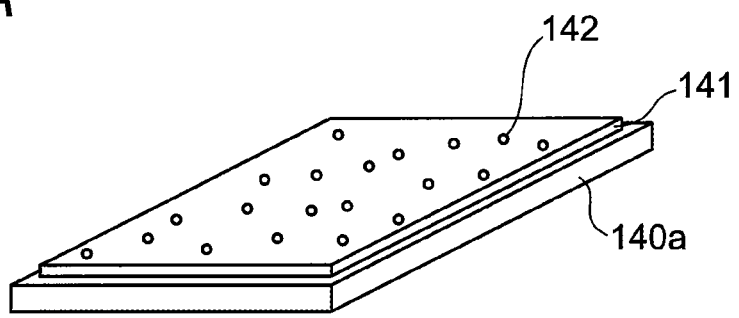
FIG. 12A is a schematic perspective view illustrating spacer particles scattered on a thin glass plate in the method of producing the transmission grating according to a fourth embodiment of the present invention.

Then, as shown in FIG. 12A, spacer particles 142 such as spherical silica particles are scattered with approximately uniform distribution on the upper surface of the thin glass plate 141 that is superposed on the glass plate 140*a*.

Figure 12B:
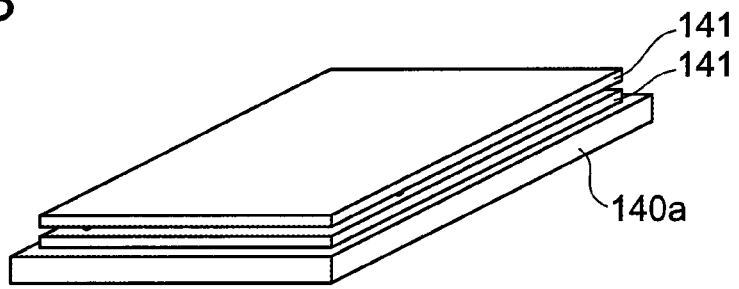
FIG. 12B is a schematic perspective view illustrating another thin glass plate placed on the spacer particles scattered on a thin glass plate in the method of producing the transmission grating according to a fourth embodiment.

Then, as shown in FIG. 12B, another thin glass plate 141 is superposed on the upper surface of the thin glass plate 141 having the spacer particles 142 scattered thereon.

Figure 12C:
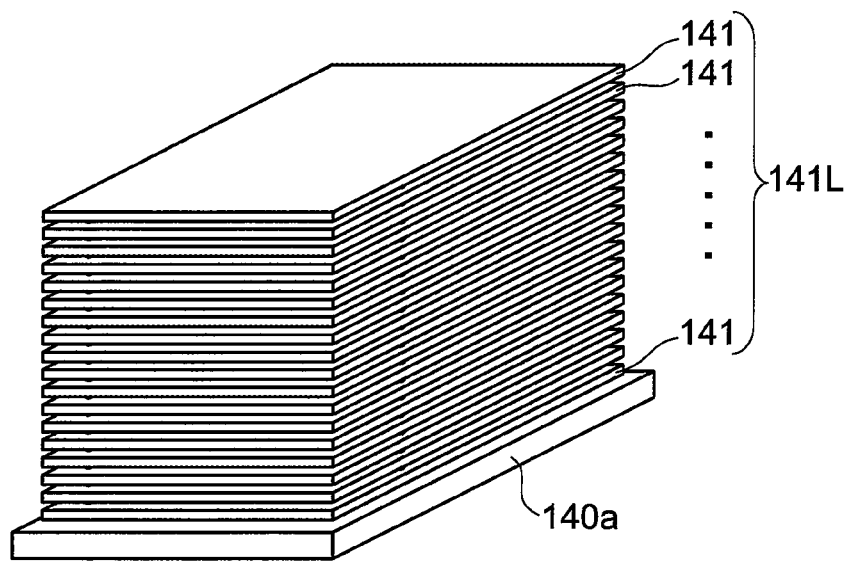
FIG. 12C is a schematic perspective view illustrating a multi-layered glass structure assembled by stacking a predetermined number of thin glass plates on one another, in the method of producing the transmission grating according to the fourth embodiment.

Scattering the spacer particles 142 on the upper surface of the thin glass plate 141 and superposing another thin glass plate 141 on the upper surface of the thin glass plate 141 having the spacer particles 142 scattered thereon are repeated to superpose a necessary number of the thin glass plates 141, thus obtaining the multi-layered glass structure 141L, as shown in FIG. 12C. The space between two adjacent thin glass plates 141 is determined by the diameter of the spacer particles 142.

(b) Confining

Figure 12D:
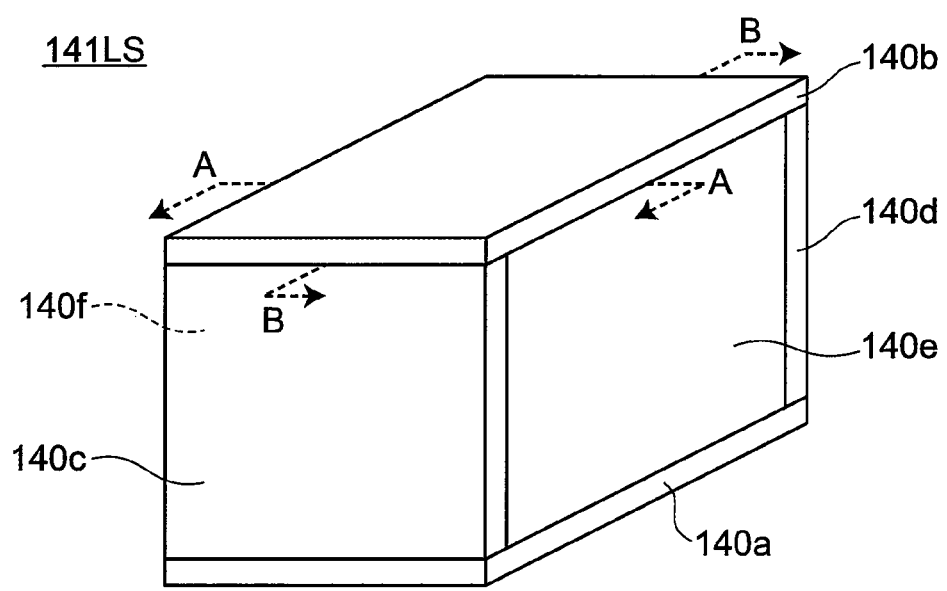
FIG. 12D is a schematic perspective view illustrating sealing of the multi-layered glass structure in a method of producing the transmission grating according to the fourth embodiment.
Figure 12E:
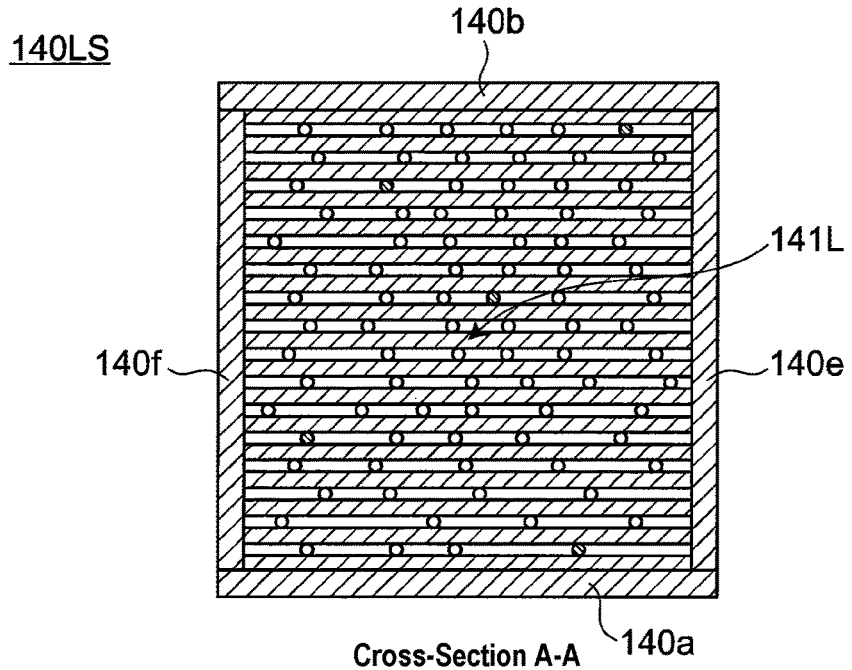
FIG. 12E is a schematic cross-sectional view taken along line A-A of FIG. 12D.
Figure 12F:
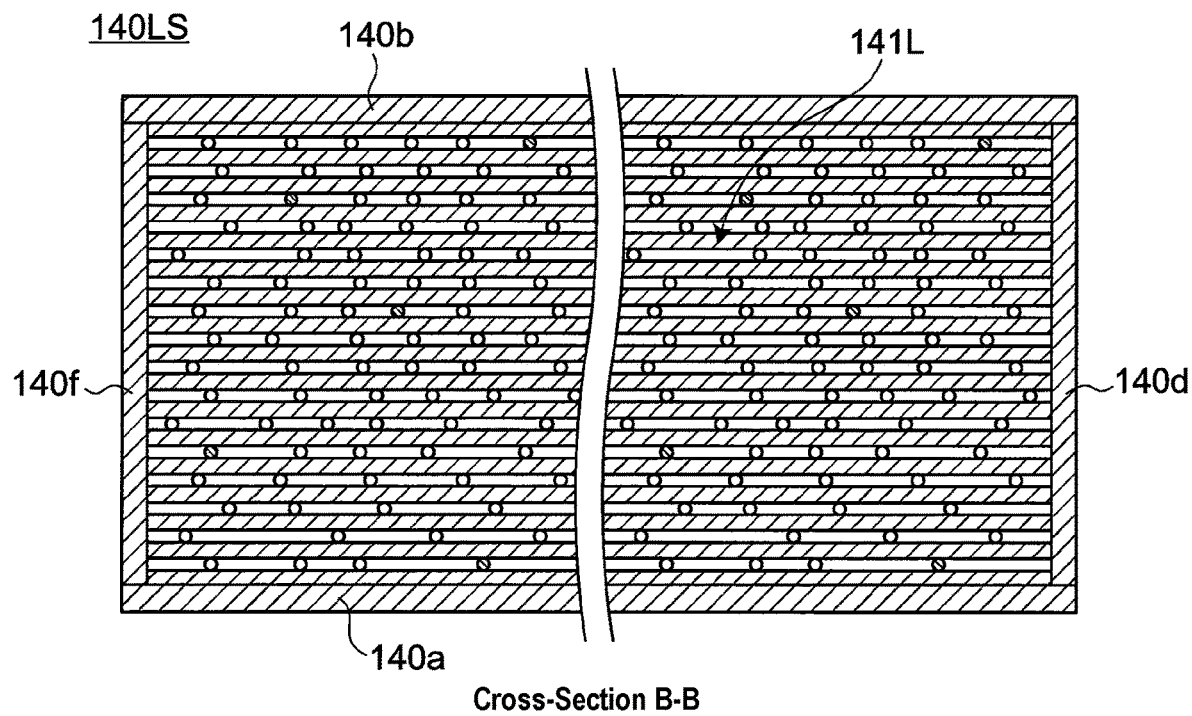
FIG. 12F is a schematic cross-sectional view taken along B-B of FIG. 12D.

A glass plate 140*b* having approximately the same dimensions as the glass plate 140*a* is superposed on the upper surface of the multi-layered glass structure 141L, and glass plates 140*c*, 140*d*, 140*e*, and 140*f* are placed respectively on four lateral surfaces of the multi-layered glass structure 141L, then, the glass plates 140*c*, 140*d*, 140*e*, 140*f* are fused to the multi-layered glass structure 141L, as shown in FIG. 12D. Accordingly, in the multi-layered glass structure 141L, air is confined in the predetermined spaces maintained by the spacing particles 142 between each adjacent two thin glass plates 141, as shown in FIG. 12E, 12F. In the description below, the multi-layered glass structure 141L sealed by fusing the glass plates 140*a*, 140*b*, 140*c*, 140*d*, 140*e*, and 140*f*, and confining air in the confined spaces between each adjacent thin glass plates 141 may be referred to as "sealed multi-layered glass structure 141LS", and the "sealed multi-layered glass structure 141LS" includes the fused glass plates 140*a*, 140*b*, 140*c*, 140*d*, 140*e*, and 140*f*.

(c) Supporting

Figure 13:
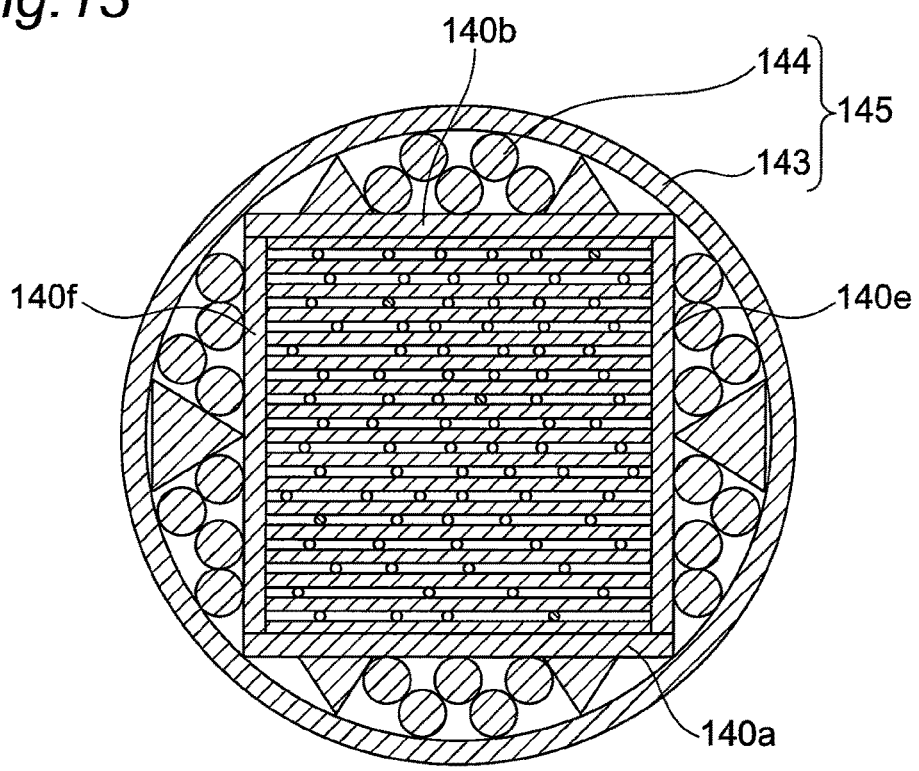
FIG. 13 is a schematic cross-sectional view illustrating the supporting of the sealed multi-layered glass structure by the glass support structure in the method of producing the transmission grating according to the fourth embodiment.

As shown in FIG. 13, the sealed multi-layered glass structure 141LS is supported by the glass support structure, at the upper surface, the lower surface, and two lateral surfaces opposite to each other with respect to a central axis (hereinafter may be simply referred to as "central axis c1") that is in parallel to the upper surface and the lower surface.

More specifically, a circular glass tube 143 having an inner diameter greater than the diagonal length at a cross-section perpendicular to the central axis c1 of the sealed multi-layered glass structure 141LS, and a length greater than the length of the sealed multi-layered glass structure 141LS in the central axis direction is provided, and the sealed multi-layered glass structure 141LS is inserted along the central axis direction in the circular glass tube 143. Subsequently, in order to fix the sealed multi-layered glass structure 141LS in the circular glass tube 143, glass rods 144 are inserted in the gap between the inside wall of the circular glass tube and the sealed multi-layered glass structure 141LS. FIG. 0.13 shows an example where round rods and polygonal rods are employed for the glass rods 144. In the description below, a structure that includes the support structure 145 formed with the circular glass tube 143 and glass rods 144, and the sealed multi-layered glass structure 141LS supported by the support structure 145 may be referred to as a preform.

(d) Drawing

Figure 14:
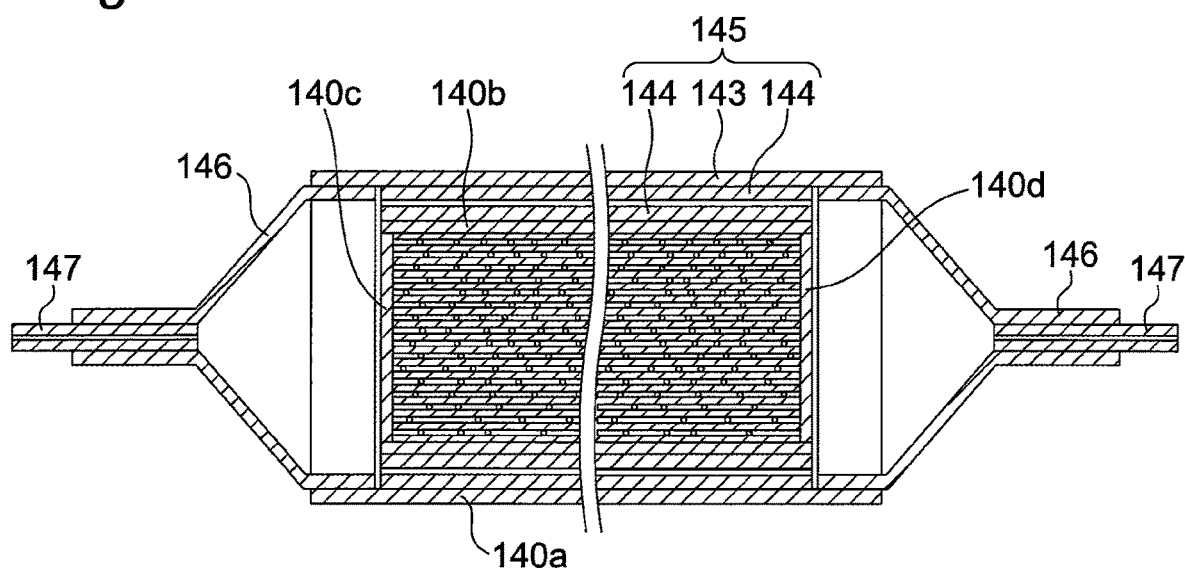
FIG. 14 is a schematic cross-sectional view illustrating the sealed multi-layered glass structure being supported by the glass support structure, prior to drawing, in the method of producing the transmission grating according to a fourth embodiment.
Figure 15:
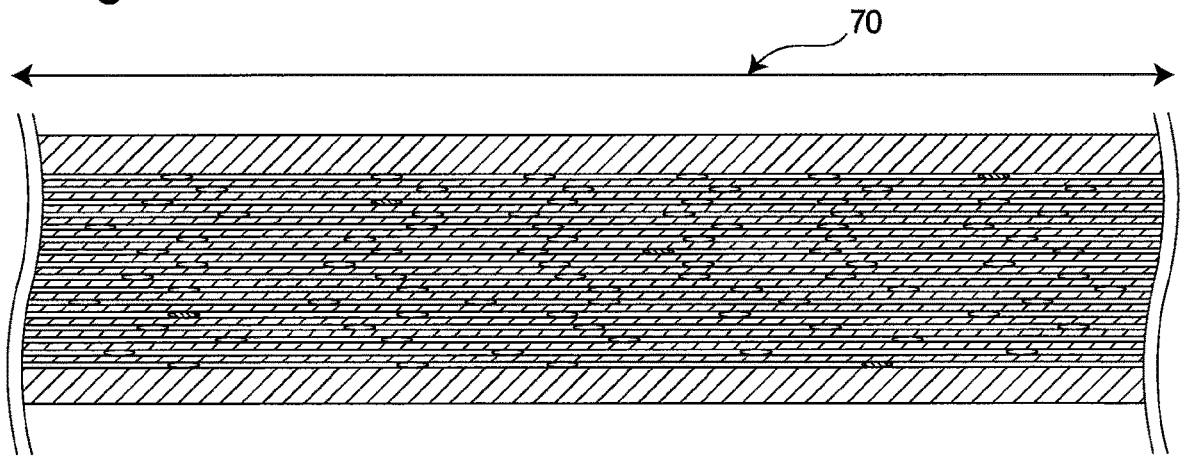
FIG. 15 is a schematic cross-sectional view illustrating the sealed multi-layered glass structure being supported by the glass support structure, after drawing, in the method of producing the transmission grating according to the fourth embodiment.

The preform including the multi-layered glass structure 141L (sealed multi-layered glass structure 141LS) and the glass support structure 145 are heated and collectively softened, then drawn in the central axis c1 direction. The preform includes, for example as shown in FIG. 14, a support tube 146 provided at each of the both ends of the circular glass tube 143 to support the end of the circular glass tube 143, and an extension tube 147 provided at an end portion of each of the support tubes. Drawing of the multi-layered glass structure 141L (sealed multi-layered glass structure 141LS) can be performed with the use of a heating furnace such as those used in manufacturing glass rods while measuring the outer diameter. A schematic diagram of a state after drawing is shown in FIG. 15. The ratio of drawing may be determined based on the thickness $T_1$ of each of the thin glass plates 141, distance between each adjacent two thin glass plates 141, the thickness of each of the thin glass plates 141, and distance between each adjacent two thin glass plates 141 that are needed after the drawing.

For example, when the transmission grating is produced by using a thin glass plates 141 of a refractive index $n_1$, it is preferable to determine the thickness $T_1$ of each of the thin glass plates before the drawing, the distance between each adjacent two thin glass plates before the drawing, and the amount of the drawing, such that the distance $t_2$ between each adjacent two thin glass plates 141 after the drawing, in μm, is in a range of $0.4/4\pi(n_1^2-1)^{1/2}$ to the thickness $t_1$ of each of the thin glass plates after the drawing. The ratio of drawing can be set to, for example, in a range of 100 times to 20,000 times, preferably in a range of 500 times to 10,000 times.

The materials of the circular glass tube 143 and the glass rods 144, and also of the glass plates 140*a*, 140*b*, 140*c*, 140*d*, 140*e*, and 140*f* can be selected from the materials that can be integrated with each other while being drawn. The support structure integrated in the drawing can serve as a support structure of individual transmission gratings after singulating the transmission gratings by cutting as described below.

The glass support structure 145 supporting the sealed multi-layered glass structure 141LS preferably has a shape of solid revolution (for example, a combinational shape of a cylindrical shape and a truncated cone shape). With the support structure in a shape of solid revolution, the whole of the preform can be heated uniformly.

(e) Cutting

Figure 16A:
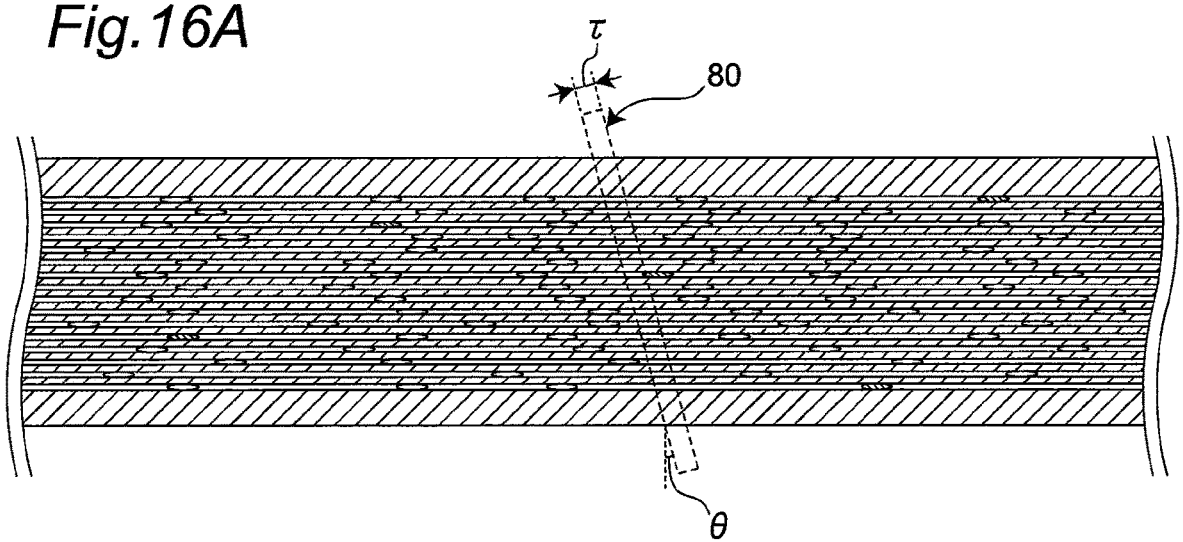
FIG. 16A is a schematic cross-sectional view illustrating the location to cut the multi-layered glass structure and the glass support structure after drawing, in the method of producing a transmission grating according to the fourth embodiment.
Figure 16B:
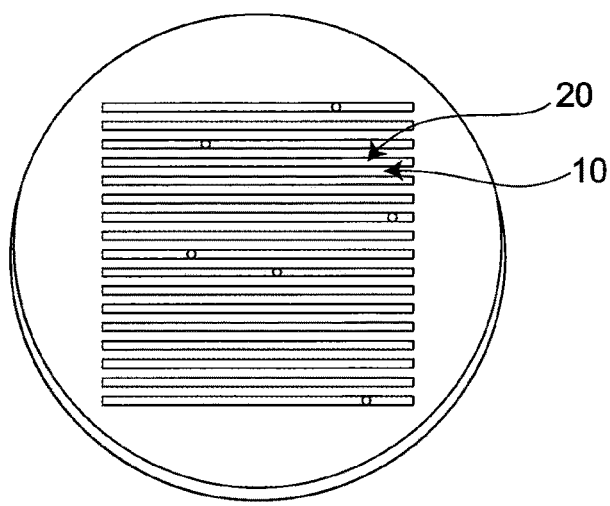
FIG. 16B is a diagram schematically showing a cut surface obtained by cutting the multi-layered glass structure and the glass support structure, in the method of producing a transmission grating according to the fourth embodiment.

As shown in FIG. 16A, together with the drawn glass support structure, the drawn multi-layered glass structure 141L is cut in parallel to a second plane that is perpendicular to a first plane that includes the central axis and a stacking direction of the thin glass plates. Thus, a transmission grating is obtained, in which, as shown in FIG. 16B, the first light-transmissive regions 10 and the second light-transmissive regions 20 of thin air layers are alternately layered. The angle of the second plane to the central axis c1 of the second plane can be appropriately set which, for example, corresponds to the tilt angle θ in the transmission grating 100 of the first embodiment. The distance between the two planes 80 cutting the drawn multi-layered glass structure corresponds to the thickness t of the transmission grating 100 of the first embodiment. As described in the first embodiment and others, in the step of cutting, the angle θ between the second plane and the central axis c1 and the distance t between the two cut surfaces are preferably set to satisfy the relationship $t_1 \cos 2\theta/\sin \theta \le t \le t_1/\sin \theta$.

In the method of producing the transmission grating of the fourth embodiment, the drawn glass support structure is sliced without using a specific machine such as a very accurate ruling machine (typically used for creating grooves of a transmission grating), an exposure machine used in photolithography, or a dry etching machine for etching, accordingly, producing of a large number of the transmission gratings with high diffraction efficiency can be realized.

Fifth Embodiment

A method of producing a transmission grating according to a fifth embodiment of the present disclosure will be described below.

The method of producing a transmission grating according to a fifth embodiment includes a step of drawing a multi-layered glass structure that is formed by stacking thin glass plates, which is similar to the method of producing the transmission grating of the fourth embodiment. However, in the method of producing the transmission grating according to the fifth embodiment, spacer particles are not used, and the multi-layered glass structure is formed to contain confined air layers, which is significantly different from the fourth embodiment. Further, cutting is performed quite differently from that in the fourth embodiment.

The method of producing the transmission grating according to the fifth embodiment includes:

(a) providing a plurality of thin glass plates of a same thickness, each having a first main surface, a second main surface opposite to the first main surface, a first lateral surface, a second lateral surface, a third lateral surface, and a fourth lateral surface; the first main surface of each of the thin glass plates defining one or more grooves with a predetermined opening width and extending from the first lateral side to the third lateral surface opposite to the first lateral surface;

(b) stacking the plurality of thin glass plates so that opening edges of longitudinal sides defining each of the one or more grooves are aligned inclined at an angle θ with respect to a line normal to the first main surface, in a vertical cross-section, to assemble a multi-layered glass structure;

(c) fusing an end surface portion of the multi-layered glass structure that includes the first lateral surface of the thin glass plates, an end surface portion of the multi-layered glass structure that includes the second lateral surface of the thin glass plates, an end surface portion of the multi-layered glass structure that includes the third lateral surface of the thin glass plates, and an end surface portion of the multi-layered glass structure that includes the fourth lateral surface of the thin glass plates, to bond adjacent thin glass plates and also seal the grooves;

(d) supporting the multi-layered glass structure containing the sealed grooves with a glass support structure at the upper surface, the lower surface, the end surface containing the second lateral surfaces of the thin glass plates, and the end surface containing the fourth lateral surfaces of the thin glass plates and located opposite to the end surface containing the second lateral surfaces with respect to the central axis;

(e) heating the multi-layered glass structure together with the glass support structure to collectively soften, and drawing the multi-layered glass structure and the glass support structure in a direction parallel to the central axis; and (f) cutting the drawn multi-layered glass structure together with the drawn glass support structure in a direction parallel to a first plane that is perpendicular to the central axis to obtain a first cut; and (g) further cutting the obtained first cut that includes a portion of the drawn multi-layered glass structure and a corresponding portion of the drawn glass support structure in a direction parallel to a second plane that is in parallel to the extending direction of the grooves to obtain a second cut.

Next, with referring to FIG. 17A to FIG. 19C, the method of producing the transmission grating according to the fifth embodiment will be described in detail below.

(a) Providing Thin Glass Plates

Figure 17A:
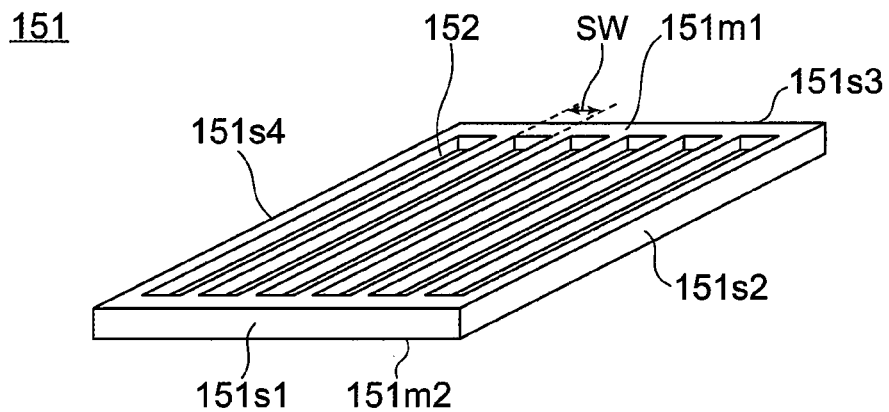
FIG. 17A is a schematic perspective view of a thin glass plate defining an array of periodic grooves in the method of producing a transmission grating according to a fifth embodiment.

As shown in FIG. 17A, a plurality of thin glass plates 151 each having periodically formed grooves are provided. Each of the thin glass plates 151 has a first main surface 151$m$1 and a second main surface 151$m$2 opposite to the first main surface 151$m$1, and a first lateral surface 151$s$1, a second lateral surface 151$s$2, a third lateral surface 151$s$3, and a fourth lateral surface 151$s$4, and a substantially uniform thickness. As shown in FIG. 17A, the first main surface 151$m$1 of each of the thin glass plates 151 is formed with grooves 152 extending from the first lateral surface 151$s$1 side toward the third lateral side 151$s$3 side with a predetermined opening width sw, which are arranged from the second lateral surface 151$s$2 side toward the fourth lateral surface 151$s$4 side at a certain period. For the method of forming the grooves, a known method such as wet etching, dry etching, micro-blasting, superfine finish of surface by grinding, laser beam machining, or a combination of those methods, or the like can be used. Of those, it is preferable to employ a method that can provide a good flatness in the processed surface, good controllability of groove depth, good controllability of tilt angle of lateral surfaces, and small reaction force in forming the grooves, example of such methods include a laser-induced backside wet etching method.

(b) Stacking

Figure 17B:
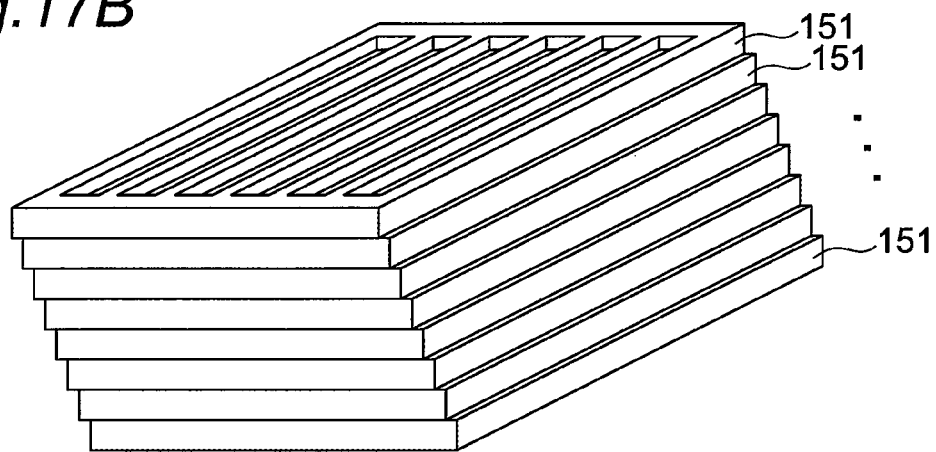
FIG. 17B is a schematic perspective view of a stack of a plurality of thin glass plates each defining a plurality of grooves, in the method of producing the transmission grating according to the fifth embodiment.
Figure 17C:
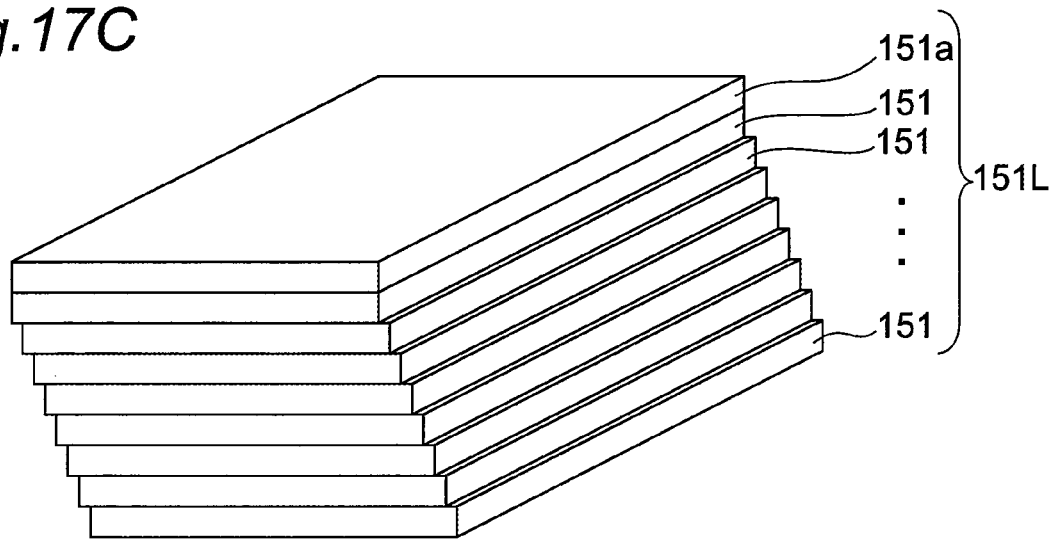
FIG. 17C is a schematic perspective view illustrating a thin glass plate absent of grooves placed on a stack of a plurality of thin glass plates each defining a plurality of grooves, in the method of producing the transmission grating according to the fifth embodiment.

As shown in FIG. 17B, the plurality of thin glass plates 151 are stacked so that opening edges of longitudinal sides defining each of the grooves (i.e., longitudinal opening edges substantially in parallel to the second lateral surface 151$s$2 and the fourth lateral surface 151$s$4) are aligned in a first direction that is inclined at an angle θ with respect to a line normal to the first main surface, in a vertical cross-section. The angle between the plane including the longitudinal opening edges defining each of the grooves 152 and a line normal to the thin glass plates corresponds to the tilt angle θ of the transmission grating of the first embodiment. As shown in FIG. 17C, a single thin glass plate 151$a$ that is not formed with and groove 152 is superposed on the uppermost surface of the stacked thin glass plates to complete the multi-layered glass structure 151L. The central axis of the multi-layered glass structure 151L is substantially in parallel to the longitudinal opening edges defining each groove 152.

(c) Sealing

Figure 17D:
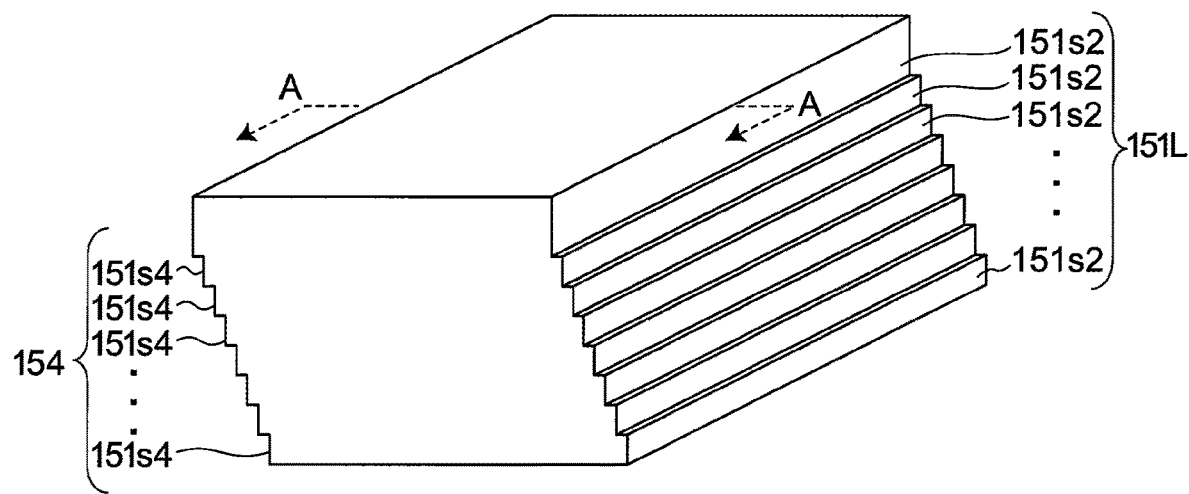
FIG. 17D is a schematic perspective view illustrating the stack of the plurality of thin glass plates being fused together, in the method of producing the transmission grating according to the fifth embodiment.
Figure 17E:
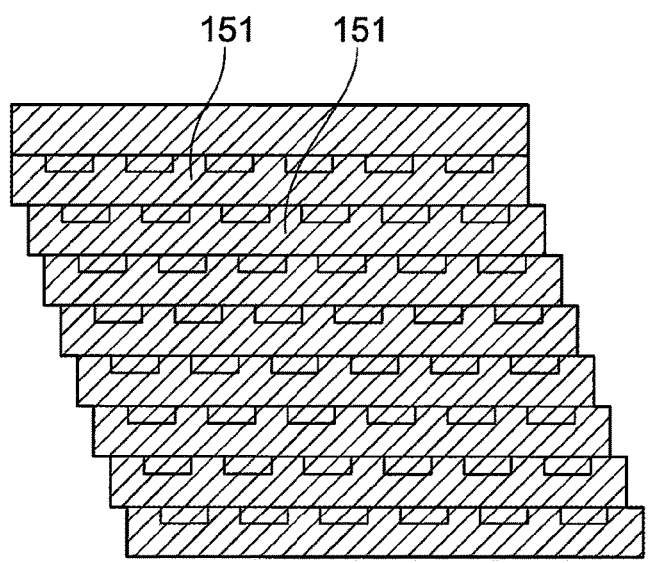
FIG. 17E is a schematic cross-sectional view taken along line A-A of FIG. 17D.
Figure 18:
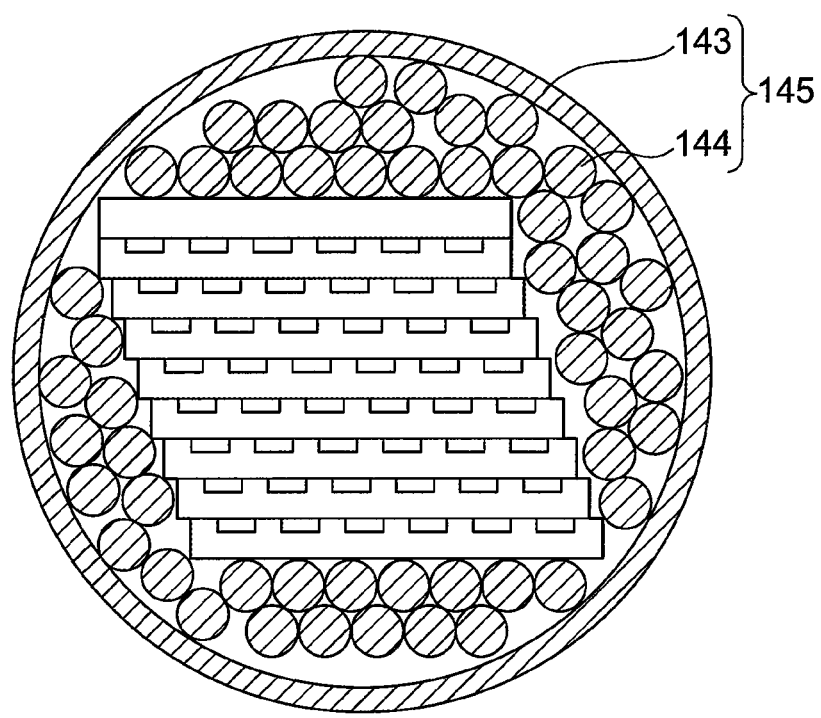
FIG. 18 is a schematic cross-sectional view illustrating the multi-layered glass structure supported by the glass support structure in the method of producing the transmission grating according to the fifth embodiment.

As shown in FIG. 17D and FIG. 17E, an end surface portion of the multi-layered glass structure 151L that includes the first lateral surface 151$s$1 of the thin glass plates 151, an end surface portion of the multi-layered glass structure 151L that includes the second lateral surface 151$s$2 of the thin glass plates 151, an end surface portion of the multi-layered glass structure 151L that includes the third lateral surface 151s3 of the thin glass plates 151, and an end surface portion of the multi-layered glass structure 151L that includes the fourth lateral surface 151s4 of the thin glass plates 151, are fused to bond adjacent thin glass plates 151 to seal the grooves 152. Accordingly, the grooves 152 are sealed.

(d) Supporting

By the glass support structure 145 that is similar to that in the fourth embodiment, the multi-layered glass structure 151L is supported at locations of the upper surface and the lower surface of the multi-layered glass structure 151L containing the sealed grooves, the end surface 153 including the second lateral surfaces 151s2 of the thin glass plates 151, and the end surface 154 containing the fourth lateral surfaces 151s4 of the thin glass plates 151 and located opposite to the end surface containing the second lateral surfaces with respect to the central axis.

More specifically, similar to that in the fourth embodiment, the multi-layered glass structure 151L is inserted in the circular glass tube 143, with the central axis of the multi-layered glass structure 151L maintained in parallel to the central axis of the circular glass tube 143. Subsequently, in order to fix the sealed multi-layered glass structure 151L in the circular glass tube 143, glass rods 144 are inserted in the gap between the inside wall of the circular glass tube and the sealed multi-layered glass structure 151L. As described above and shown in FIG. 18, the preform including the support structure 145 formed with the circular glass tube 143 and glass rods 144, and the sealed multi-layered glass structure 151L supported by the support structure 145 is assembled.

(e) Drawing

In a similar manner as in the fourth embodiment, the multi-layered glass structure 151L is heated together with the glass support structure 145 to be collectively softened, and drawn in a direction in parallel to the central axis. In the step of drawing, for example, when the transmission grating is produced by using a thin glass plates 151 of a refractive index $n_1$, it is preferable to determine the thickness $T_1$ of each of the thin glass plates 151 before the drawing, the depth of each of the grooves before the drawing, and the amount of the drawing, such that the depth $t_2$ of each of the grooves defined in each of the thin glass plates 151 after the drawing, in μm, is in a range of $0.1/\pi(n_1^2-1)^{1/2}$ to the thickness $t_1$ under the grooves of each of the thin glass plates 151 after the drawing. As being drawn, the depths of the grooves formed in the thin glass plates 151 decrease, and also the widths of the grooves formed in the thin glass plates 151 decrease. The ratio of drawing can be set to, for example, in a range of 100 times to 20,000 times, preferably in a range of 500 times to 10,000 times.

(f) First Cutting

Figure 19A:
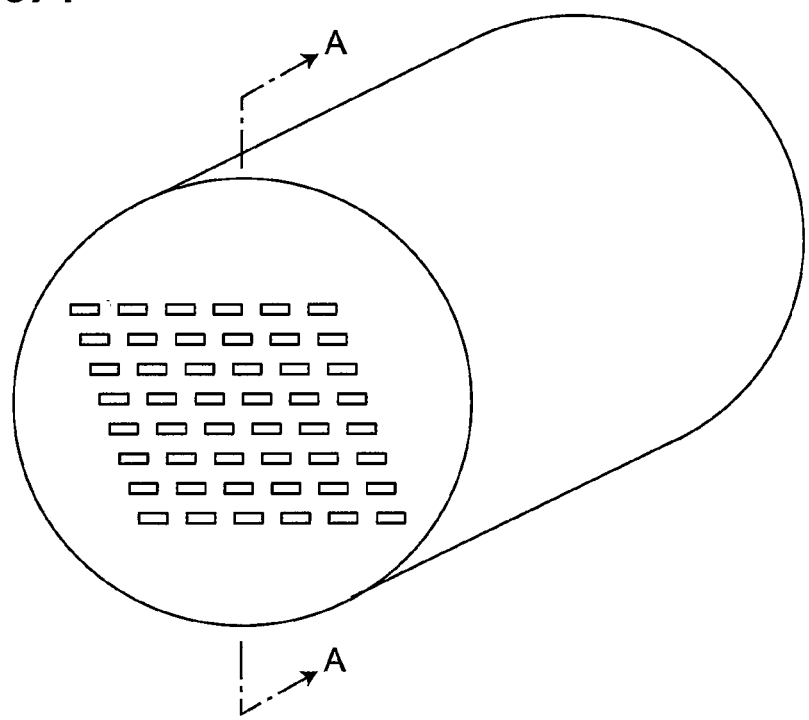
FIG. 19A is a schematic perspective view illustrating a cut surface obtained by cutting the drawn multi-layered glass structure together with the support structure, in a direction parallel to a plane perpendicular to the drawing direction.

In a first cutting, as shown in FIG. 19A, the drawn multi-layered glass structure 151L is cut together with the drawn glass support structure 145 in a direction parallel to a first plane that is perpendicular to the central axis to obtain a first cut.

(g) Second Cutting

Figure 19B:
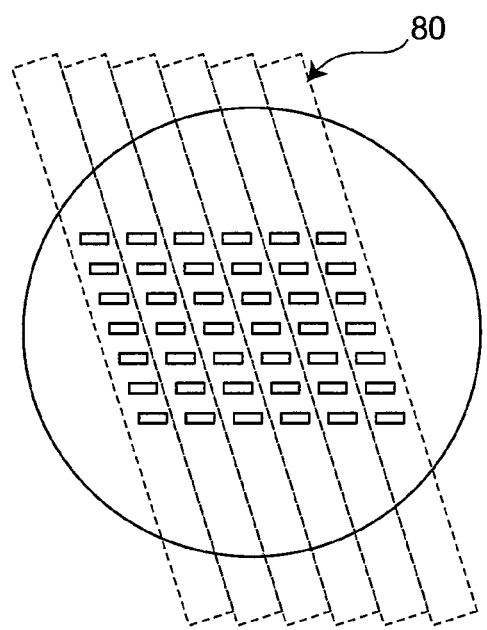
FIG. 19B is a schematic cross-sectional view illustrating cutting the cut product of the multi-layered glass structure and the support structure shown in FIG. 19A, along a plane parallel to the drawing direction.

In a second cutting, as shown in FIG. 19B, the obtained first cut that includes a portion of the multi-layered glass structure 151L and a corresponding portion of the glass support structure 145 is further cut in a direction parallel to a second plane 80 that is in parallel to the central axis to obtain a second cut. The second plane is substantially in parallel to the first direction described in the step of stacking.

The second plane is substantially in parallel to the planes described in the step of stacking, the planes on which the longitudinal opening edges defining the grooves 152 are located. The angle between a line normal to the first main surface of the thin glass plates and the second plane corresponds to the tilt angle θ in the transmission grating 100 of the first embodiment, for example. The product of the groove width after the drawing and cos θ (i.e., distance between the flat light-incident surface and the flat light-emitting surface) corresponds to the thickness t of the transmission grating 100 of the first embodiment. As described in the first embodiment and other, it is preferable to set such that the distance t between the flat light-incident surface and the flat light-emitting surface is in a range satisfying $t_1 \cos 2\theta/\sin \theta \leq t \leq t_1/\sin \theta$, that is, the groove width after the drawing is in a range satisfying $t_1 \cos 2\theta/\sin \theta \cos \theta \leq t \leq t_1/\sin \theta \cos \theta$.

According to the method of producing the transmission grating according to the fifth embodiment, the transmission grating that is free from the scattering of light caused by the spacer particle, and exhibits high diffraction efficiency can be produced. Moreover, the thickness t (i.e., distance between the flat light-incident surface and the flat light-emitting surface) can be controlled mainly by the width of the grooves in the step of providing the thin glass plates, and the amount of drawing in the step of drawing. Thus, obtaining desired dimensions is easier than by employing polishing whose dimensional accuracy is ±several microns. According to the method of producing the transmission grating according to the fifth embodiment, producing of a large number of the transmission grating with high diffraction efficiency can be realized with good production yield.

EXAMPLES

Example 1

In Example 1, the transmission grating in which the first light-transmissive region 10 is made of a transparent quartz glass and the second light-transmissive region 20 is the air, will be produced according to the method of producing the transmission grating of the third embodiment.

Steps of producing in the Example 1 will be described below in due order.

Providing Glass Plate

Two transparent quartz glass plates (refractive index 1.46) are provided.

Processing Glass Plate

On each of the transparent quartz glass plates provided as described above, a Cr metal film is disposed by using a sputtering method, and then a resist film is disposed thereon by using a spin coating method. Subsequently, using a photolithography technique (stepper, electron beam drawing device, etc.), the resist film is exposed to predetermined light at a predetermined period with a pitch of 3.16 μm, then, the resist is developed to obtain a resist pattern of periodically aligned stripe shapes, on the metal film. Subsequently, using the elongated resist pattern as a mask, the Cr metal film under the mask is dry-etched by using a dry-etching machine (for example, an inductively-coupled plasma reactive ion etching (ICP-RIE) machine), and further, using the Cr metal film as a mask and using the dry-etching machine, the transparent quartz glass plate is etched. The shape to be obtained by etching can be controlled by the shape of the metal mask and the dry-etching conditions (such as type of gas(es) and the flow rate(s) for dry etching, the etching pressure, RF power, or the like). In the production of the transmission grating of Example 1, dry-etching is carried out while adjusting the dry-etching conditions as needed, to obtain the resulting shapes matched to a designed shape. The Cr metal film mask remains on the quartz glass plate is removed by using an etchant that intended to exclusively dissolve Cr. Thus, two glass plates 130 each made of transparent quartz glass formed with the elongated trapezoidal protrusions 131 between elongated reverse trapezoidal grooves 132, as shown in FIG. 11A are provided. In the glass plates 130, the pitch of the trapezoidal protrusions 131 (i.e., diffraction grating period) is 3.16 μm, the width of upper surfaces of the protrusions is 1.52 μm, the width at the bottom of the trapezoidal protrusions is 1.60 μm, and the height of the protrusions is 0.76 μm.

Engaging

Subsequently, as shown in FIG. 11B, one of the two glass plates 130 is turned over and superposed on the second glass plate 130 such that the recesses and the protrusions of the two glass plates 130 are engaged with each other, and one of the glass plates 130 is pushed to one side so that the two glass plate 130 are in contact with each other at one side of lateral wall surfaces.

Bonding

Subsequently, as shown in FIG. 11C, while maintaining one of the two glass plates being pushed to one side as described above, the two glass plates 130 are integrally bonded. As described above, the transmission grating of quartz glass formed with integrally bonded two protruding portions 131 and two glass base portions 133, confining thin air layers aligned at a tilt angle θ is obtained. The bonding may be carried out by using a method such as pressure fusing or bonding (using an adhesive that has a refractive index equivalent to the refractive index of the quartz glass, or direct joining.

Figure 11D:
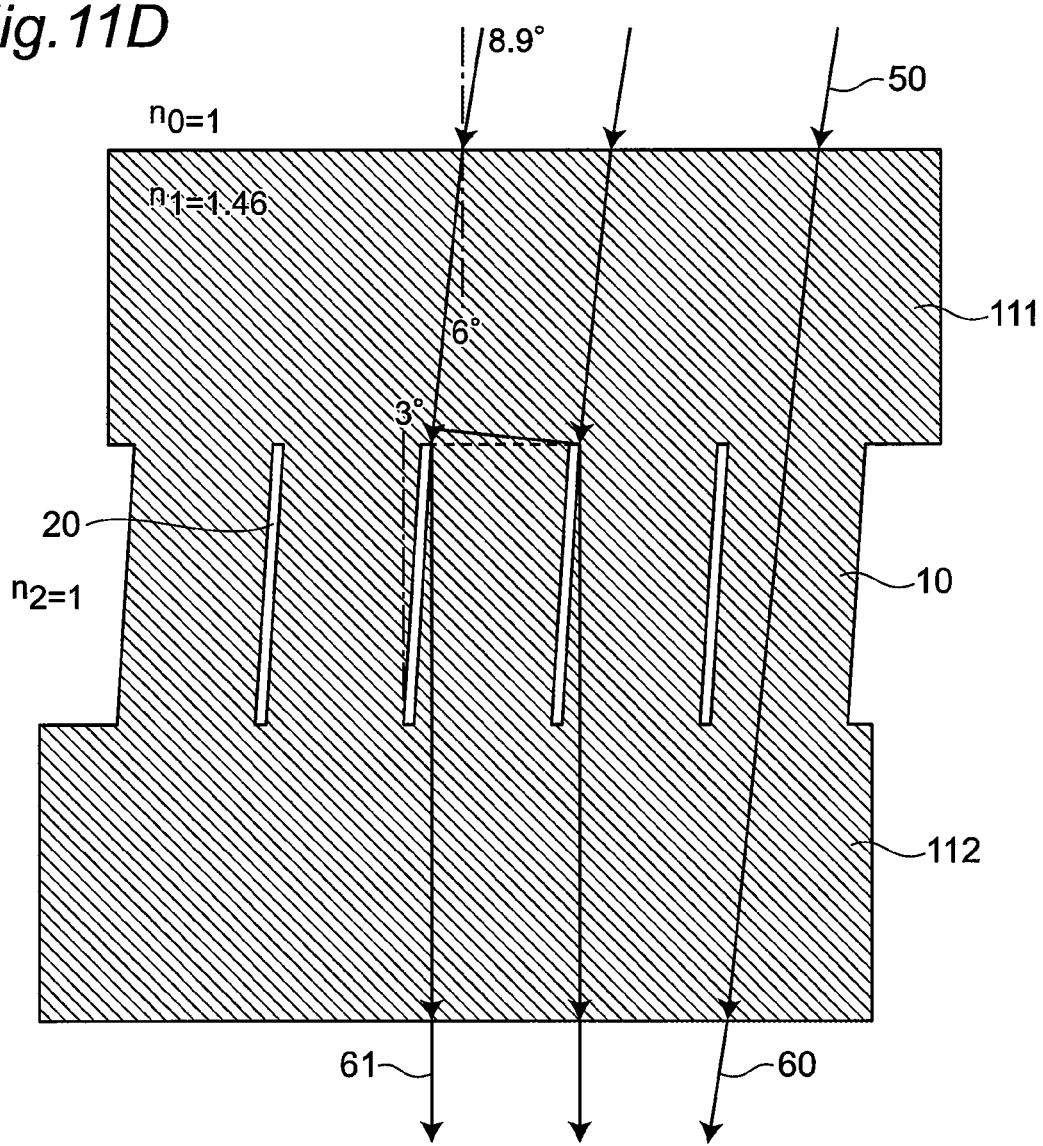
FIG. 11D is a schematic diagram of a cross-section illustrating diffraction of light beams in the transmission grating according to the third embodiment.

At last, finish polishing is applied on the surfaces at the incident side and the light-emitting side. The transmission grating produced as described above has the values of; θ≈3.01°, $t_1$≈3117 nm, and $t_2$≈39 nm. The surface at the incident side is provided with an antireflection layer made of a dielectric multilayer film and the surface at the emission side is provided with a reflection control layer made of a dielectric multilayer film. As illustrated in FIG. 11D, when light of a wavelength λ=488 nm is incident on the flat light-incident surface at an angle of 8.9° with respect to the line normal to the flat light-incident surface, the wavelength of the light in the quartz glass becomes 334 nm and at an angle of 6.08°, passes through the transmission grating in which thin layers of air are aligned at an angle 3° with respect to the line normal to the flat light-incident surface, then first-order transmitted diffracted light 61 is emitted from the flat light-emitting surface in a direction perpendicular to the flat light-emitting surface.

The transmission grating of Example 1 produced as described above does not have a metal or the like that absorbs light on the optical path, which can eliminate generation of heat due to absorption of light and/or deterioration due to the generated heat. Thus, even when operated with high optical density, deviation of optical path caused by the generated heat and deterioration of the component due to light can be negligible, and reliability of the transmission grating can be improved.

The glass plate 130 having periodically provided elongated trapezoidal protrusions can singly serve as a transmission grating, but the transmission grating of Example 1 has a configuration in which the first (or second) lateral surfaces defining the elongated reverse trapezoidal grooves of one of the two glass plates 130 are closely fit with the first (or second) lateral surfaces of the elongated trapezoidal protrusions of the other one of the two glass plates 130, and bonded to each other. With this configuration, intensity of second-order transmitted diffracted light is reduced compared to that of a single transmission grating, and intensity of the first-order transmitted diffracted light can be enhanced. Because two glass plates (i.e., transmission gratings) are integrated together, higher mechanical strength than that of a single glass plate (i.e., transmission grating). Alternatively, a first and a second two transmission gratings of the same diffraction grating period that can be engaged to each other with the protrusions of the first transmission grating and the recesses of the second transmission grating, the lateral surfaces of the protrusions of the first transmission grating and the lateral surfaces of the recesses of the second transmission grating being substantially in parallel to each other can also be used.

Example 2

In Example 2, a transmission grating that can further reduce zero-order transmitted diffracted light 60 compared to that in Example 1 is produced according to the method illustrated in the fourth embodiment. Steps of producing in Example 2 will be described below.

Providing Thin Glass Plates

A plurality of thin glass plates 141 having the same width, length, and thickness (for example, refractive index 1.51, thickness 0.05 mm, width 500 mm, and length 1,000 mm) are provided.

Stacking

A single glass plate 140a with a thickness of 7 mm (width 514 mm, length 1,014 mm) is provided, and one of the thin glass plates 141 is placed co-center on the glass plate 140a with its peripheral edges substantially in parallel to the peripheral edges of the glass plate 140a. As shown in FIG. 12A, spacer particles 142 (for example, spherical silica particles of diameter 5 μm used in manufacturing liquid crystals) are spread in dry conditions on the thin glass plate 141 in single-particle state. Then, as shown in FIG. 12B, another one of the thin glass plates 141 is superposed on the thin glass plate 141 that has been placed on the glass plate 140a. Scattering the spacer particles 142 and superposing the thin glass plates 141 are alternately repeated to form the multi-layered glass structure 141L having 10,000 superposed thin glass plates 141, shown in FIG. 12C. The superposing is performed in air, so that the spacer particles 142 and air are interposed between adjacent thin glass plates 141.

Sealing

Further, the lateral surfaces and the upper surface of the multi-layered glass structure 141L are respectively covered by a glass plate of 7 mm thickness 140b to 140f. The glass plates 140a to 140f are thermally fused to the upper and lower surfaces and the lateral surfaces of the multi-layered glass structure 141L, to obtain the sealed multi-layered glass structure 141LS shown in FIG. 12D. At this time, the outer peripheral portions of each of the thin glass plates 141 are thermally fused to corresponding portions of the glass plates of 7 mm thickness 140c to 140f that surround the lateral surfaces of the multi-layered glass structure 141L. Accordingly, layers of air are confined between the thin glass plates 141.

Supporting

Further, the sealed multi-layered glass structure 141LS is inserted in the circular glass tube (thickness of 7 mm, inner diameter of 765 mm) 143 and the glass rods 144 are inserted to fill the gap between the inside wall of the circular glass tube and the sealed multi-layered glass structure 151L. As shown in FIG. 13 and FIG. 14, the glass support includes the circular glass tube 143 and the glass rods 144. As described above, the preform is formed with the sealed multi-layered glass structure LS and the glass support structure. Forming the glass support structure in a shape of solid revolution (for example, a combinational shape of a cylindrical shape and a truncated cone shape) is to achieve uniform heating in the step of drawing.

Drawing

Next, heat is applied and the preform is drawn in the direction of its central axis. By drawing the preform about 916 times gives the sealed multi-layered glass structure LS (glass assembly rod) with an outer diameter of 25.7 mm, shown in FIG. 15. With the air in the multi-layered glass structure L kept confined, the air between the glass support structure and the multi-layered glass structure L is discharged while drawing, through the support tube 146 and the extension tubes 147, from the openings of the preform. At this time, the circular glass tube 143 and the glass rods 144 are thermally fused to integrate together. Meanwhile, the portions of the multi-layered glass structure L confining the layers of air are drawn and become thin gaps containing air. After being drawn, the arrangement period of the thin glass plates is about 1/30.3 of that in the preform, which gives a period of 1.817 μm (1.652 μm thickness of each thin glass plate, 0.165 μm thickness of each air layer).

Cutting

As shown in FIG. 16A, the multi-layered glass structure L (a shape of solid revolution) is sliced with a thickness of 1 mm, along a plane perpendicular to a plane including the central axis that is substantially parallel to the drawing direction of the multi-layered glass structure L (a shape of solid revolution) and also substantially parallel to a plane tilted at an angle θ of 9.97° to a line normal to the thin glass plates 141, to obtain a plurality of slices of glass assembly (FIG. 16B). One planar side of the slices of glass assembly (FIG. 16B) are optically polished, and the polished surface is bonded to a double-side optically polished thick glass plate (thickness of 5 mm, refractive index of 1.51). At this time, bonding is carried out so that air bubbles or the like do not enter the interface of bonding. The bonding can be carried out by employing a known bonding method, for example, using a transparent adhesive or thermally fusing. In order to prevent polishing particles from entering the slices of glass assembly (i.e., between the thin glass plates) at the time of polishing, polyvinyl alcohol (PVA) or the like may be filled between the thin glass plates in the slices of glass assembly, which can be removed after the polishing, by using warm water or an organic solvent.

Optical Polishing

Each of the other planar surfaces of the slices of glass assembly is polished to reduce the thickness and optical polishing is applied such that the diffraction grating (a layered structure of thin glass plates and air layers in a slice of glass assembly) has a thickness t of 9 μm (a thickness in arrange of 8.97 μm to 9.54 μm), that is, a total thickness of the diffraction grating and the thick glass plate (thickness of 5 mm) 5.009 mm.

Bonding Thick Glass Plate

A thick glass plate (thickness of 5 mm, refractive index of 1.51) is bonded on the polished surface of each of the diffraction gratings. Thus, a plurality of transmission gratings (one of which is shown in FIG. 7) are produced.

Disposing Dielectric Multilayer Film

In the transmission grating of Example 2, an antireflection film made of a dielectric multilayer film (for example, $Al_2O_3$ film (refractive index 1.64)/$ZrO_2$ film (refractive index 2.00)/$MgF_2$ film (refractive index 1.38)) is further disposed on the polished surface of one of the thick glass plates to serve as the flat light-incident surface of the laser light. A dielectric multilayer film of a desired reflectance is disposed on the polished surface of the other one of the thick glass plates to adjust the amount of second-order reflected and diffracted light feeding back to the laser.

In the transmission grating of Example 2, as described above, the glass assembly (glass assembly rod) is sliced in parallel to a plane that tilts at angle (θ=9.97°) to the line normal to the thin glass plates 141, thus, the diffraction grating period is 1.845 μm.

When the p-polarized constituent of a linearly polarized laser light of wavelength 950 nm is incident on the flat light-incident surface of the transmission grating of Example 2 at an incident angle 31°, according to Snell's law, the laser light is refracted at an angle of refraction of 19.94° at the interface between air and the thick glass plate of refractive index 1.51. With the wavelength 629 nm in the thick glass plate, the laser light propagates toward the diffraction grating region with a diffraction grating period of 1.845 μm. The conditions for the first-order diffraction are satisfied, enhancing the intensity of the first-order diffracted light, and first-order transmitted diffracted light is emitted in a direction normal to the thick glass plate. With the incident angle 31°, the allowed diffraction orders are limited to 0, 1, and 2, with the diffraction angles 31°, 0°, and −31°, respectively. Light propagating in each of the thin glass plates is incident on the interface between the thin glass plate and air at an incident angle of 80.03° that is greater than the critical angle of 41.47°, thus satisfying the condition for total internal reflection. The thickness of each of the air layers is 0.1652 μm, which is 17.4% of the wavelength 950 nm, and greater than twice the thickness of the evanescent field (i.e., a thickness 7.2% of the wavelength at an incident angle 80.03°. Thus, the intensity of transmitted light is negligible. The diffraction grating has a thickness of 9 μm, allowing substantial elimination of zero-order transmitted diffracted light that rectilinearly propagating in the thin glass plate without incident on the interface between the thin glass plate and air layer. Generally, except for the intensity of zero-order diffracted light, the intensity of first-order diffracted light is greater than the intensity of second- or higher-order diffracted light, accordingly, incident light can be efficiently converted to the first-order diffracted light.

After slicing the glass assembly to about 1 mm thickness, the thickness of the sliced glass assembly is further reduced to about 9 μm to eliminate or reduce multiple reflections in the thin glass plates located between thin air layers. The thickness about 9 μm does not have sufficient mechanical strength for handling, thus a thick glass plate is bonded on both planar sides. In conventional transmission gratings, reflected light at the upper surface and the lower surface of diffraction grating will be resulting in optical loss. However, in the transmission grating of Example 2 the diffraction grating is placed between the thick glass plates of a same refractive index, which can eliminate or reduce specularly reflected light but allows specular reflected light (and first-order and second-order reflected and diffracted light) at the incident-side edge of the thin layer of 0.165 μm thickness. The surface of thick glass plate to serve as the laser light incident surface is provided with the antireflection film made of a dielectric multilayer film, which allows reducing the occurrence of reflected light.

In the method of producing according to Example 2, the transmission gratings are obtained by slicing the multi-layered glass structure LS (glass assembly rod), which allows producing a number of transmission gratings at once, and thus has good mass productivity compared to the methods in which individual diffraction gratings are engraved by using electron beam drawing technique or interference exposure technique. According to the Example 2, the preform of 1,000 mm length is drawn to about 916 times and sliced to 1 mm thickness, thus, 900,000 or more diffraction gratings can be produced.

The transmission grating of Example 2 produced as described above does not have a metal or the like that absorbs light on the optical path, which can substantially eliminate generation of heat and/or deterioration due to absorption of light. Thus, even when operated with high optical density, deviation of optical path caused by the generated heat and deterioration of the component due to light can be negligible, and reliability of the transmission grating can be improved.

In place of spreading the spacer particles 142 (spherical silica particles) in single-particle state, a plurality of protrusions may be formed on the surfaces of the thin glass plates by etching or the like. When the thin glass plates have a first surface and a second surface opposite to the first surface and the first surface is smoother than the second surface, the first surface is used to form the light-first reflecting interface 27. A plurality of protrusions may be formed by etching or the like on the second surfaces of the thin glass plates, and the etched surfaces are placed as the lower surfaces of the first light-transmissive regions 10. This is to enhance first-order transmitted diffracted light by reflect light at the light-first reflecting interface 27. Stacking of the thin glass plates may be performed by winding a thin glass sheet onto a spinning square pillar, and cutting the wound thin glass sheet at each edge of the square pillar.

Example 3

In Example 3, a transmission grating is produced according to the method illustrated in the fifth embodiment. Steps of producing in Example 3 will be described below.

Providing Thin Glass Plate with Grooves

A plurality of thin glass plates 151 of a same thickness (for example, refractive index 1.51, thickness 0.03 mm, width 500 mm, and length 500 mm) each formed with a plurality of grooves 151 in one surface (a first main surface) are provided.

In Example 3, for example, six grooves 152 are formed in the drawing direction in the first main surface of each of the thin glass plates, with a length of 450 mm, a depth of 1.5 µm, a bottom width of 160 µm, and a period of 92 mm. As shown in FIG. 17A, the six grooves are formed such that a flat portion with a width of about 20 mm is left between the outer peripheral edge of the thin glass plates 151 and the edges of the grooves. For the method of forming the grooves, a known method such as wet etching, dry etching, microblasting, superfine finish of surface by grinding, laser beam machining, or a combination of those methods, or the like can be used. It is preferable to employ a method that can provide a good flatness in the processed surface, good controllability of groove depth, good controllability of tilt angle of lateral surfaces defining the grooves, and small reaction force in forming the grooves, example of such methods include a laser-induced backside wet etching method illustrated in Japanese Unexamined Patent Application Publication No. 2004-306134.

In Example 3, when the angle between the longitudinal lateral surfaces defining the grooves with an isosceles trapezoid shape in a cross section and the line normal to the thin glass plate is 9.82°, the intensity of second-order reflected and diffracted light incident on an edge of air layer at an angle of 19.64° can be increased and the intensity of zero-order and first-order reflected and diffracted light can be reduced. With this configuration, at the time of feeding back the second-order reflected and diffracted light to the external resonator laser, sufficient feedback amount can be reliably obtained.

Further, in Example 3, in order to reflect light at the bottom surfaces of the grooves and in order to reduce scattering loss of light, the bottom surfaces of the grooves are preferably made smooth. This configuration can increase the intensity of first-order transmitted diffracted light to be used, and can reduce second-order transmitted diffracted light that will be resulting in optical loss, and therefore preferable.

Stacking

As shown in 17B, 10,000 of the thin glass plates 151 formed with the grooves 152 as described above are stacked. Stacking is performed such that the first main surface of thin glass plate 151 formed with the grooves is in contact with the second main surface of the thin glass plate 151 formed with the grooves that is placed on the first main surface. Further, in the stacking, the long-side directions of the grooves 152 of the thin glass plates 151 are aligned in parallel to the drawing direction, with the long-side edges of the grooves 152 of corresponding thin glass plates 151 laid on the same plane. The plane including the long-side edges described above is tilted at 9.82° to the line normal to the first main surfaces of the thin glass plates 151. As shown in FIG. 17C, a single thin glass plate 151a that is not formed with and groove 152 is superposed on the uppermost surface of the stacked thin glass plates to complete the multi-layered glass structure 151L.

Sealing

At the surface and near-surface portion of the four lateral surfaces of the multi-layered glass structure 151L, the thin glass plates 151 are thermally fused to each other to confine the air in the grooves 152, as shown in FIG. 17D and FIG. 17E.

Drawing

Further, the multi-layered glass structure 151L is inserted in the circular glass tube 143 (thickness of 7 mm, inner diameter of 771 mm) and glass rods 144 are inserted to fill the gap between the inside wall of the circular glass tube and the sealed multi-layered glass structure 151L, and the both ends of the circular glass tube are narrowed to obtain a preform. Subsequently, the preform is placed in a drawing machine and heat is applied, and then heated preform is drawn. In Example 3, the preform is drawn to about 916 times to obtain the outer diameter of 23.44 mm. In this state, the period of the grooves that confine thin layers of air become about 1/33.5 of that in the preform, which gives a period in the stacking direction of 0.896 µm (in which, a thickness t1 from the bottom of a groove to the upper surface of adjacent groove is ≈0.8512 µm, thickness $t_2$ of air layer confined in each groove is ≈0.0448 µm, and the bottom width of each groove is 4.776 µm), and a period in the direction perpendicular to the stacking direction of ≈2.75 mm.

Cutting

As shown in FIG. 19A, the extended multi-layered glass structure 151L (glass assembly rod in a cylindrical shape) is cut, for example, in parallel to a plane perpendicular to the central axis of the multi-layered glass structure 151L, to a length of 30.3 mm. Then, the cut portion of the extended multi-layered glass structure 151L is further sliced in parallel to a plane in parallel to the central axis and tilt at 9.82° to a line normal to the first surfaces of the thin glass plates, to a thickness of 2.5 mm (with a cutting margin of 0.25 mm), by using, for example, a wire saw, to obtain six rectangular glass plates (width of about 23 mm, a length of 30.3 mm, and a thickness of 2.5 mm). According to Example 3, 100,000 or greater diffraction gratings can be produced from a single preform of a length of 500 mm (FIG. 19B). The slicing is performed such that the array of air layers of the grooves is located approximately the center of the thickness of each sliced plated. In this case, the array of air layers of the grooves that constitute the diffraction grating is located at the center region of each of the rectangular glass plates, with an aspect ratio of 2:1.

Optical Polishing

The both sides of the glass plates obtained by slicing the portions of the glass assembly rod as described above are optically polished. When the glass plate is placed so that the cross-section of the grooves is in a reverse trapezoidal shape, the upper surface of the glass plate serves as the light incident surface and the lower surface of the glass plate serves as the light emission surface. By adjusting the thickness of slicing, the amount of polishing can be adjusted, and the step of bonding a thick glass plate as in Example 2 can be omitted.

Disposing Dielectric Multilayer Film

In Example 3, an antireflection film made of three layers of dielectric film is disposed on the light-emitting side of the transmission grating. At this time, the surface at the light-emitting side can be made to a partially reflecting mirror, which allows adjustment of the amount of feedback the semiconductor laser by the reflectance of the dielectric multilayer film. With this configuration, the need of an external partially reflecting mirror in a WBC laser device can be eliminated. By integrally structuring the partially reflecting mirror that has been provided externally with the diffraction grating, locational misalignment that has been occurred between the external partially reflecting mirror and the diffraction grating can be eliminated and reliability of the laser device can be improved.

When the transmission grating produced in Example 3 is used in a WBC laser device, the rectangular glass plate is arranged such that the array of air layers of the grooves that constitutes the diffraction grating is placed perpendicular to the horizontal plane of incidence (which includes the optical axis), to allow, for example, elliptical p-polarized semiconductor laser light (wavelength of 460 nm, and an ellipticity ratio (the ratio of major axis (12 mm) and minor axis (6 mm) is 2:1) to be incident on the plane of incidence at an angle of 30.5°. According to Snell's law, the incident light is refracted at the interface (corresponding to the surface outer side of the first light-transmissive plate 111 in FIG. 7) between air and the glass at an angle of refraction 19.64°. The thicknesses of the air layers of the grooves are smaller than the glass, thus most of incident light is linearly propagates in the glass and incident on the interface (i.e., light-first reflecting interface 27) between the glass at the bottom of the groove and air layer at an incident angle of 80.18°. The incident angle is greater than the critical angle of 41.47°, thus the incident light is totally internally reflected at the light-first reflecting interface 27. This is because the thickness 0.0448 µm of the air layers of the grooves corresponds to 9.7% of the wavelength 460 nm and greater than the thickness 7.22% of the evanescent field. Thus, the intensity of transmitted light is negligible. Meanwhile, the width of about 4.8 µm of the air layers of the grooves is not small enough to allow linearly propagating light transmitting through without being reflected, but also large enough to allow reflected light to be reflected at the interface (second light-reflecting interface) at the upper surface of adjacent groove. Thus, zero-order diffracted light can be sufficiently reduced. The first-order transmitted diffracted light specularly reflected once at the light-reflecting interface propagates perpendicularly to the light-reflecting interface (i.e., a surface corresponding to outer-side surface of the second light-transmissive plate 112 in FIG. 7). The propagating direction of the incident light in the glass and the interface between glass and air at the flat light-incident surface side of the air layer are perpendicular to each other. Thus, incident light at the edge of the thin air layer is reflected and returns to the semiconductor laser as second-order reflected and diffracted light. Also, the light reflected at the light-emitting side of the interface made into a partially reflecting mirror is retroreflectively reflected to the semiconductor laser as second-order reflected and diffracted light.

In the step of forming the grooves in Example 3, shallow grooves of a depth of 1.5 µm are formed, but in the case where a laser-induced backside wet etching method is employed, deep grooves of an aspect ratio greater than 100 can be formed. Thus, transparent glass plates (a thickness of 2 mm) formed with deep grooves can be used in place of the glass plates formed with the shallow grooves.

The transmission gratings described in the embodiments and examples above can be used as a wavelength dispersive element in wavelength beam combining light emitting devices. Accordingly, the transmission gratings described in the embodiments and examples above can be used in light emitting devices in various industrial applications (such as heating, cutting, welding). Also, the transmission gratings described in the embodiments and examples above can be used as a wavelength dispersive element in optical apparatus such as spectroscopes.

Obviously, numerous modifications and variations of the present invention are possible in light of the above teachings. It is therefore to be understood that within the scope of the appended claims, the invention may be practiced otherwise than as specifically described herein.

What is claimed is:

1. A laser device comprising:
   a laser array configured to emit a plurality of laser beams of different wavelengths $\lambda_i$ to one another from different positions;
   a transmission grating comprising:
      a plurality of first light-transmissive regions having a refractive index of $n_1$, and
      a plurality of second light-transmissive regions having a refractive index of $n_2$ that is smaller than $n_1$,
      wherein the first light-transmissive regions and the second light-transmissive regions are alternately disposed,
      wherein the transmission grating has a flat light-incident surface and a flat light-emitting surface, and a diffraction grating period of d,
      wherein, among a plurality of interfaces between the first light-transmissive regions and the second light-transmissive regions, light-reflecting interfaces on which light transmitted through the first light-transmissive regions is incident are in parallel with one another and are inclined such that a line normal to each of the light-reflecting interfaces is at an inclination angle θ with respect to the flat light-incident surface and to the flat light-emitting surface, wherein 0°<θ<90°, and wherein, when a thickness of the first light-transmissive regions in a direction perpendicular to the light-reflecting surfaces is $t_1$ and a thickness of the second light-transmissive regions in a direction perpendicular to the light-reflecting surfaces is $t_2$, the thickness $t_2$, in μm, is in a range of $0.1/\pi(n_1^2-n_2^2)^{1/2}$ to $t_1$; and an optical system located between the laser array and the transmission grating, and configured to direct the plurality of laser beams of different wavelengths $\lambda_i$ emitted from the laser array to be incident on the flat light-incident surface of the transmission grating at an incident angle $\alpha_i$ corresponding to each of the plurality of laser beams of different wavelengths $\lambda_i$;

wherein each of the wavelengths $\lambda_i$ and the incident angle $\alpha_i$ corresponding to the wavelength $\lambda_i$ satisfies d sin $\alpha_i=\lambda_i$.

2. The laser device according to claim 1, wherein a distance t between the flat light-incident surface and the flat light-emitting surface is in a range of $t_1 \cos 2\theta/\sin \theta$ to $t_1/\sin \theta$.

3. A transmission grating comprising:

a plurality of first light-transmissive regions having a refractive index of $n_1$; and a plurality of second light-transmissive regions having a refractive index of $n_2$ that is smaller than $n_1$;

wherein the first light-transmissive regions and the second light-transmissive regions are alternately disposed;

wherein the transmission grating has a flat light-incident surface and a flat light-emitting surface, and a diffraction grating period of d;

wherein, among a plurality of interfaces between the first light-transmissive regions and the second light-transmissive regions, light-reflecting interfaces on which light transmitted through the first light-transmissive regions is incident are in parallel with one another and are inclined such that a line normal to each of the light-reflecting interfaces is at an inclination angle θ with respect to the flat light-incident surface and to the flat light-emitting surface, wherein 0°<θ<90°;

wherein, when a thickness of the first light-transmissive regions in a direction perpendicular to the light-reflecting surfaces is $t_1$ and a thickness of the second light-transmissive regions in a direction perpendicular to the light-reflecting surfaces is $t_2$, the thickness $t_2$, in is in a range of $0.1/\pi(n_1^2-n_2^2)^{1/2}$ to $t_1$;

wherein the transmission grating is configured such that, when a plurality of laser beams of different wavelengths $\lambda_i$ to one another are incident on the flat light-incident surface of the transmission grating at an incident angle $\alpha_i$ corresponding to each of the plurality of laser beams of different wavelengths $\lambda_i$, diffracted light ray groups are emitted perpendicularly from the flat light-emitting surface of the transmission grating;

wherein each of the wavelengths $\lambda_i$ and the incident angle $\alpha_i$ corresponding to the wavelength $\lambda_i$ satisfies $d\sin\alpha_i=\lambda_i$.

4. The transmission grating according to claim 3, wherein a distance t between the flat light-incident surface and the flat light-emitting surface is in a range of $t_1 \cos 2\theta/\sin \theta$ to $t_1/\sin \theta$.

5. The transmission grating according to claim 3, further comprising a dielectric multilayer film on the flat light-emitting surface.

6. The transmission grating according to claim 4, further comprising a dielectric multilayer film on the flat light-emitting surface.

* * * * *

UNITED STATES PATENT AND TRADEMARK OFFICE
CERTIFICATE OF CORRECTION

PATENT NO. : 11,002,893 B2
APPLICATION NO. : 15/961090
DATED : May 11, 2021
INVENTOR(S) : Yukitoshi Marutani Page 1 of 1

It is certified that error appears in the above-identified patent and that said Letters Patent is hereby corrected as shown below:

In the Claims

Claim 1, Column 37, Line 18:
Please delete:
"$\alpha_i$ corresponding to the wavelength $\Delta_i$ satisfies $d \sin \alpha_i = \lambda_i$."
Please replace with:
"$\alpha_i$ corresponding to the wavelength $\lambda_i$ satisfies $d\sin\alpha_i = \lambda_i$."

Claim 2, Column 37, Line 22:
Please delete:
"$t_1 \cos 2\theta/\sin \theta$"
Please replace with:
"$t_1\cos2\theta/\sin\theta$"

Claim 3, Column 38, Lines 12-13:
Please delete:
"the thickness $t_2$, in is in a range"
Please replace with:
"the thickness $t_2$, in μm, is in a range"

Claim 4, Column 38, Line 27:
Please delete:
"$t_1 \cos 2\theta/\sin \theta$"
Please replace with:
"$t_1\cos2\theta/\sin\theta$"

Signed and Sealed this
Fourteenth Day of September, 2021

Drew Hirshfeld
*Performing the Functions and Duties of the
Under Secretary of Commerce for Intellectual Property and
Director of the United States Patent and Trademark Office*